US009598520B2

(12) United States Patent
Kiridoshi et al.

(10) Patent No.: US 9,598,520 B2
(45) Date of Patent: Mar. 21, 2017

(54) RADIATION-SENSITIVE RESIN COMPOSITION, POLYMER AND METHOD FOR FORMING A RESIST PATTERN

(75) Inventors: Yuko Kiridoshi, Tokyo (JP); Takehiko Naruoka, Tokyo (JP); Yukio Nishimura, Tokyo (JP); Yusuke Asano, Tokyo (JP); Takanori Kawakami, Tokyo (JP); Hiromitsu Nakashima, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/473,957

(22) Filed: May 17, 2012

(65) Prior Publication Data

US 2012/0295197 A1 Nov. 22, 2012

Related U.S. Application Data

(63) Continuation of application No. PCT/JP2010/070412, filed on Nov. 16, 2010.

(30) Foreign Application Priority Data

Nov. 18, 2009 (JP) ................................. 2009-263401
Nov. 20, 2009 (JP) ................................. 2009-264882

(51) Int. Cl.
| | | |
|---|---|---|
| G03F 7/004 | (2006.01) | |
| G03F 7/38 | (2006.01) | |
| C08F 220/24 | (2006.01) | |
| C08F 228/00 | (2006.01) | |
| C08F 220/22 | (2006.01) | |
| C08L 33/14 | (2006.01) | |
| G03F 7/039 | (2006.01) | |
| G03F 7/11 | (2006.01) | |
| G03F 7/20 | (2006.01) | |

(52) U.S. Cl.
CPC .......... *C08F 220/22* (2013.01); *C08F 220/24* (2013.01); *C08F 228/00* (2013.01); *C08L 33/14* (2013.01); *G03F 7/0046* (2013.01); *G03F 7/0397* (2013.01); *G03F 7/11* (2013.01); *G03F 7/2041* (2013.01)

(58) Field of Classification Search
CPC . G03F 7/0397; G03F 7/30; G03F 7/38; G03F 7/2041; C08F 18/20; C08F 2218/20; C08F 228/00; C08F 220/24
USPC ........... 430/270.1, 326, 907, 910; 526/292.4, 526/292.5, 308, 309, 288, 292.3, 243, 253
See application file for complete search history.

(56) References Cited

U.S. PATENT DOCUMENTS

| | | | |
|---|---|---|---|
| 4,876,165 A | 10/1989 | Brewer et al. | |
| 4,910,122 A | 3/1990 | Arnold et al. | |
| 5,674,648 A | 10/1997 | Brewer et al. | |
| 6,280,897 B1 * | 8/2001 | Asakawa et al. | 430/270.1 |
| 7,718,342 B2 * | 5/2010 | Funatsu | C08F 220/06 430/270.1 |
| 7,998,654 B2 * | 8/2011 | Nishiyama et al. | 430/270.1 |
| 8,252,504 B2 * | 8/2012 | Harada et al. | 430/270.1 |
| 8,298,745 B2 * | 10/2012 | Furuya et al. | 430/270.1 |

(Continued)

FOREIGN PATENT DOCUMENTS

| | | |
|---|---|---|
| EP | 2088466 | 8/2009 |
| EP | 2325694 A1 | 5/2011 |

(Continued)

OTHER PUBLICATIONS

International Search Report for corresponding International Application No. PCT/JP2010/070412, Mar. 8, 2011.
Chinese Office Action for corresponding CN Application No. 201080045526.1, Jan. 14, 2013.
Extended European Search Report for corresponding EP Application No. 10831562.3-1304, Sep. 23, 2013.
Japanese Office Action for corresponding JP Application No. 2011-541929, Apr. 16, 2013.
Korean Office Action for corresponding KR Application No. 10-2012-7009977, Aug. 19, 2013.
Chinese Office Action for corresponding CN Application No. 201080045526.1, Oct. 11, 2013.

(Continued)

*Primary Examiner* — John S Chu
(74) *Attorney, Agent, or Firm* — Oblon, McClelland, Maier & Neustadt, L.L.P.

(57) ABSTRACT

A radiation-sensitive resin composition includes a first polymer, a second polymer and a radiation-sensitive acid generator. The first polymer has a structure unit represented by a following formula (1-1), a structure unit represented by a following formula (1-2), or both thereof, and has a content of fluorine atoms of no less than 5% by mass to a total mass of the first polymer. The second polymer has an acid-dissociable group, and has a content of fluorine atoms of less than 5% by mass to a total mass of the second polymer.

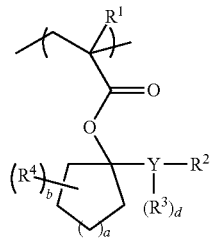

(1-1)

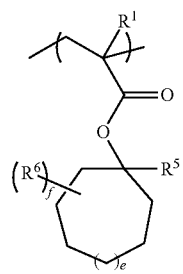

(1-2)

14 Claims, No Drawings

(56) References Cited

U.S. PATENT DOCUMENTS

| | | | |
|---|---|---|---|
| 8,367,297 B2* | 2/2013 | Kawaue et al. | 430/270.1 |
| 2005/0153232 A1* | 7/2005 | Li et al. | 430/270.1 |
| 2006/0216643 A1 | 9/2006 | Li et al. | |
| 2007/0275324 A1 | 11/2007 | Allen et al. | |
| 2009/0197204 A1* | 8/2009 | Shiono et al. | 430/286.1 |
| 2009/0202945 A1* | 8/2009 | Nakagawa et al. | 430/286.1 |
| 2009/0208873 A1* | 8/2009 | Harada et al. | 430/286.1 |
| 2010/0255420 A1* | 10/2010 | Sakakibara | C08F 220/18 430/285.1 |
| 2010/0285405 A1* | 11/2010 | Shimokawa et al. | 430/270.1 |

FOREIGN PATENT DOCUMENTS

| | | |
|---|---|---|
| JP | 06-012452 B2 | 5/1984 |
| JP | 59-093448 | 5/1984 |
| JP | 05-188598 | 7/1993 |
| JP | 2005-173474 | 6/2005 |
| JP | 2005-352384 | 12/2005 |
| JP | 2006-048029 | 2/2006 |
| JP | 2008-308545 | 12/2008 |
| JP | 2008-308546 | 12/2008 |
| JP | 2009-134088 | 6/2009 |
| JP | 2009-191151 | 8/2009 |
| JP | 2010-139662 | 6/2010 |
| JP | 2010-277043 | 12/2010 |
| WO | WO 2007/116664 | 10/2007 |
| WO | WO 2009/057484 | 5/2009 |
| WO | WO-2009057484 * | 5/2009 |

OTHER PUBLICATIONS

Japanese Office Action for corresponding JP Application No. 2011-541929, Dec. 3, 2013.
Chinese Office Action for related application No. 201080045526.1, issued Apr. 21, 2014, with English language translation, 9 pages.
European Office Action for related application No. 10 831 562.3-1302, dated May 9, 2014, 3 pages.
Office Action issued May 20, 2014, in corresponding Taiwan Patent Application No. 099139516 (with English-language Translation).
Japanese Office Action issued Mar. 10, 2015 in Patent Application No. 2011-541929 (with English Translation).
Office Action issued Oct. 29, 2014 in Chinese Patent Application No. 201080045526.1 (with English language translation).
Japanese Office Action issued Mar. 29, 2016, in Japanese Patent Application No. 2015-093488 (with English Translation).

* cited by examiner

RADIATION-SENSITIVE RESIN COMPOSITION, POLYMER AND METHOD FOR FORMING A RESIST PATTERN

CROSS-REFERENCE TO RELATED APPLICATIONS

The present application is a continuation application of International Application No. PCT/JP2010/070412, filed Nov. 16, 2010, which claims priority to Japanese Patent Application No. 2009-263401, filed Nov. 18, 2009 and to Japanese Patent Application No. 2009-264882, filed Nov. 20, 2009. The contents of these applications are incorporated herein by reference in their entirety.

BACKGROUND OF THE INVENTION

Field of the Invention

The present invention relates to a radiation-sensitive resin composition, a polymer and a method for forming a resist pattern.

Discussion of the Background

In the field of microfabrication for producing integrated circuit elements, a lithography technique that allows for microfabrication at a level of no greater than 0.10 μm (subquater-micron level) has been desired in order to attain a higher integrity. However, according to conventional lithography techniques, a near ultraviolet ray such as i-ray is used as a radioactive ray; therefore, microfabrication at the level described above has been extremely difficult. Thus, in order to allow for microfabrication at the aforementioned level, development of lithography techniques carried out using a radioactive ray with a shorter wavelength have been performed. The radioactive ray with a shorter wavelength may involve, for example, bright line spectra of a mercury-arc lamp, far ultraviolet rays such as excimer laser, X-ray, electron beams, and the like. Of these, KrF excimer laser (wavelength: 248 nm) and ArF excimer laser (wavelength: 193 nm) have attracted attention.

As the excimer laser has attracted attention, a number of materials of resist films for excimer laser have been proposed. Such materials include, for example, compositions (hereinafter, may be also referred to as "chemically amplified resists") that contain a component having an acid-dissociable group, and a component (hereinafter, may be also referred to as "acid generator") that generates an acid upon irradiation with a radioactive ray (hereinafter, may be also referred to as "exposure"), whereby a chemical amplification effect thereof is used, and the like (see Japanese Unexamined Patent Application, Publication No. 2008-308545 and Japanese Unexamined Patent Application, Publication No. 2008-308546). In this composition, the acid-dissociable group present in the resin is dissociated due to the action of an acid generated upon exposure, thereby rendering the resin have an acidic group or the like. As a result, formation of a desired resist pattern is enabled since an exposed region of the resist film becomes easily soluble in an alkaline developer.

However, in the field of microfabrication, formation of a still finer resist pattern (for example, fine resist patterns having a line width of about 45 nm) has been desired. A method for enabling a still finer resist pattern to be formed may involve, for example, decrease in the wavelength of the light source of an exposure system, increase in the number of numerical apertures (NA) of the lens, and the like. In this regard, decrease in the wavelength of the light source necessitates a novel exposure system, which would be expensive. In addition, since a trade-off lies between the resolution and the focal depth when the numerical aperture of lens is increased, it may be disadvantage in that the focal depth decreases even if resolution can be improved.

Accordingly, a method referred to as liquid immersion lithography was recently reported as a lithography technique that can solve such a problem. In this method, a liquid for liquid immersion lithography (for example, pure water, fluorine-based inert liquid, etc.) is placed between the lens and the resist film (on the resist film) during exposure. According to this method, light path-space of the exposure, which has been conventionally filled with inert gas such as air or nitrogen, is filled with a liquid for liquid immersion lithography having a refractive index (n) greater than that of the air and the like; therefore, even if the light of exposure similar to that of a conventional type is used, an effect similar to that achievable when the light of exposure has a shorter wavelength can be achieved. More specifically, higher resolving abilities can be attained, and decrease in the focal depth is enabled.

Therefore, according to such liquid immersion lithography, formation of a resist pattern is enabled at low costs, with superior ability of high resolution and also with favorable focal depth, even in the case in which a lens mounted in preexisting apparatuses is used. Thus, a large number of compositions which may be used in liquid immersion lithography have been reported (see pamphlet of PCT International Publication No. 2007/116664, Japanese Unexamined Patent Application, Publication No. 2005-173474 and Japanese Unexamined Patent Application, Publication No. 2006-48029).

SUMMARY OF THE INVENTION

According to one aspect of the present invention, a radiation-sensitive resin composition includes a first polymer, a second polymer and a radiation-sensitive acid generator. The first polymer has a structure unit represented by a following formula (1-1), a structure unit represented by a following formula (1-2), or both thereof, and has a content of fluorine atoms of no less than 5% by mass to a total mass of the first polymer. The second polymer has an acid-dissociable group, and has a content of fluorine atoms of less than 5% by mass to a total mass of the second polymer.

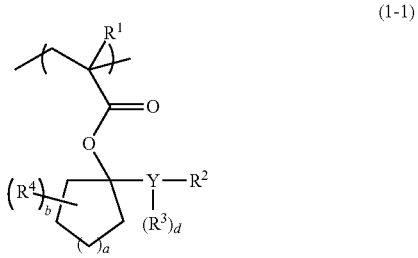

(1-1)

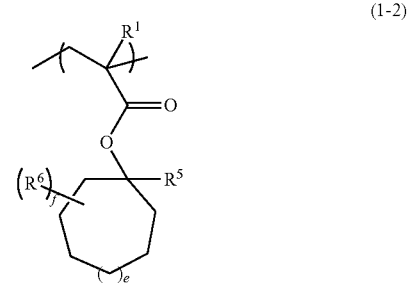

(1-2)

In the formulae (1-1) and (1-2), each $R^1$ independently represents a hydrogen atom, a lower alkyl group or a halogenated lower alkyl group. In the formula (1-1), Y represents a saturated hydrocarbon group having a valency of (2+d). $R^2$ and $R^3$ each independently represent an alkyl group, and optionally $R^2$ and $R^3$ bind with each other to form an alicyclic structure together with Y. $R^4$ represents an alkyl group, an alkoxy group, an acyl group or an acyloxy group. In a case where $R^3$ or $R^4$ is present in a plurality of number, the plurality of $R^3$ and $R^4$ are each a same or different with each other. A part or all of hydrogen atoms of $R^4$ are substituted or unsubstituted. a is 1 or 2. b is an integer of 0 to 3. d is 1 or 2. In the formula (1-2), $R^5$ represents an alkyl group. $R^6$ represents an alkyl group, an alkoxy group, an acyl group or an acyloxy group. In a case where $R^6$ is present in a plurality of number, the plurality of $R^6$ are a same or different. A part or all of hydrogen atoms of $R^6$ are substituted or unsubstituted. e is 1 or 2. f is an integer of 0 to 5.

According to another aspect of the present invention, a polymer includes a structure unit represented by a following formula (1-1), a following formula (1-2) or both thereof. The polymer has a content of fluorine atoms of no less than 5% by mass to a total mass of the first polymer.

According to further aspect of the present invention, a method for forming a resist pattern includes forming a photoresist film on a substrate using the radiation-sensitive resin composition. The photoresist film is subjected to liquid immersion lithography through a liquid for immersion lithography disposed on the photoresist film. The photoresist film subjected to liquid immersion lithography is developed to form a resist pattern.

DESCRIPTION OF THE EMBODIMENTS

An embodiment of the present invention provides a radiation-sensitive resin composition including:

(A) a polymer having at least one type of a structure unit selected from the set consisting of a plurality of structure units each represented by the following formulae (1-1) and (1-2), and having a content of fluorine atoms of no less than 5% by mass (hereinafter, may be also referred to as "polymer (A)");

(B) a polymer having an acid-dissociable group, and having a content of fluorine atoms of less than 5% by mass (hereinafter, may be also referred to as "polymer (B)"); and (C) a radiation-sensitive acid generator (hereinafter, may be also referred to as "acid generator (C)").

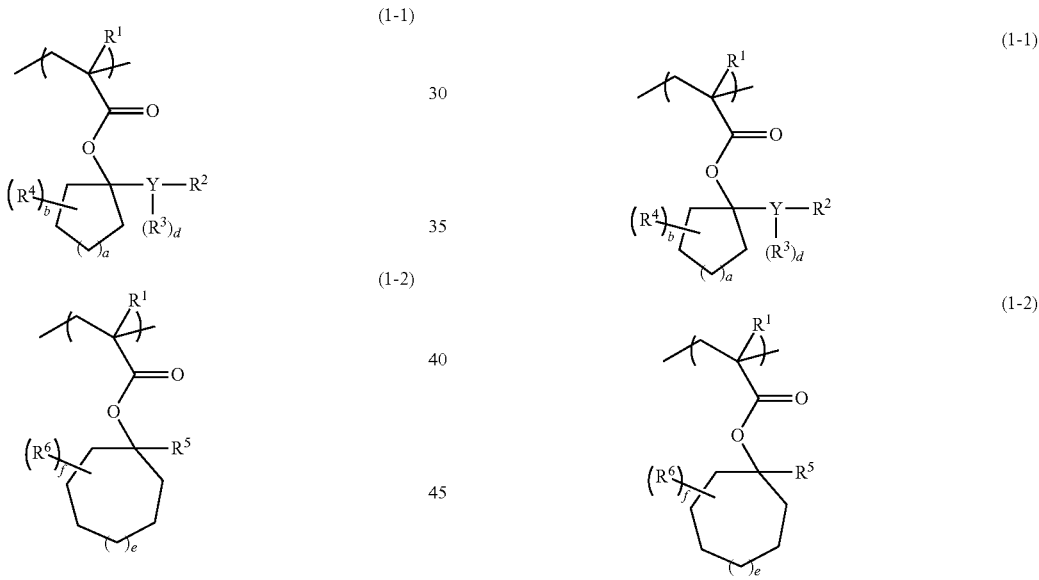

In the formulae (1-1) and (1-2), each $R^1$ independently represents a hydrogen atom, a lower alkyl group or a halogenated lower alkyl group. In the formula (1-1), Y represents a saturated hydrocarbon group having a valency of (2+d). $R^2$ and $R^3$ each independently represent an alkyl group, and optionally $R^2$ and $R^3$ bind with each other to form an alicyclic structure together with Y. $R^4$ represents an alkyl group, an alkoxy group, an acyl group or an acyloxy group. In a case where $R^3$ or $R^4$ is present in a plurality of number, the plurality of $R^3$ and $R^4$ are a same or different with each other. A part or all of hydrogen atoms of $R^4$ are substituted or unsubstituted. a is 1 or 2. b is an integer of 0 to 3. d is 1 or 2. In the formula (1-2), $R^5$ represents an alkyl group. $R^6$ represents an alkyl group, an alkoxy group, an acyl group or an acyloxy group. In a case where $R^6$ is present in a plurality of number, the plurality of $R^6$ are a same or different. A part or all of hydrogen atoms of $R^6$ are substituted or unsubstituted. e is 1 or 2. f is an integer of 0 to 5.

In the formulae (1-1) and (1-2), $R^1$ each independently represents a hydrogen atom, a lower alkyl group or a halogenated lower alkyl group. In the formula (1-1), Y represents a saturated hydrocarbon group having a valency of (2+d); $R^2$ and $R^3$ each independently represent an alkyl group, wherein $R^2$ and $R^3$ may bind with each other to form an alicyclic structure together with Y; $R^4$ represents an alkyl group, an alkoxy group, an acyl group or an acyloxy group; when $R^3$ or $R^4$ is present in a plurality of number, the plurality of $R^3$ and $R^4$ may be the same or different with each other; a part or all of hydrogen atoms of $R^4$ may be substituted; a is 1 or 2; b is an integer of 0 to 3; and d is 1 or 2.

In the formula (1-2), $R^5$ represents an alkyl group; $R^6$ represents an alkyl group, an alkoxy group, an acyl group or an acyloxy group; when $R^6$ is present in a plurality of number, the plurality of $R^6$ may be the same or different; a part or all of hydrogen atoms of $R^6$ may be substituted; e is 1 or 2; and f is an integer of 0 to 5.

The radiation-sensitive resin composition contains in addition to (B) a polymer as a base polymer for forming a resist film and (C) an acid generator, (A) a polymer having the certain structure unit (I) and having a content of fluorine atoms of no less than a certain value. Since the polymer (A) has a greater content of fluorine atoms than the polymer (B), when a resist film is formed, uneven distribution of the polymer (A) tends to occur in the surface layer of the resist film due to an oil repellent characteristic. In addition, since the polymer (A) has a structure unit that includes the certain acid-dissociable group, the radiation-sensitive resin composition is superior in MEEF performance, and can inhibit occurrence of defects such as bridge. This defect refers to a state in which a part of the pattern remaining on the substrate after the development links, and is believed to result from insufficient solubility of the components such as a polymer in a developing solution attained when deprotection (permitting dissociation of the acid-dissociable group by an action of an acid) is insufficiently executed, whereby the residues remain such that they link the pattern.

Although the reason for improving the MEEF performance and inhibitory performance of the defects such as bridge of the radiation-sensitive resin composition due to having the constitution described above has not necessarily been clarified, for example, the following reasons may be conceived. The acid-dissociable group of the polymer (A) has an alicyclic structure, and has a hydrocarbon group bound to a carbon atom adjacent to the oxygen atom of an ester group. It is believed that due to a particular relationship lying between the number of carbon atoms of the ring of this alicyclic structure, and the structure of the hydrocarbon group, dissociation of the acid-dissociable group by an acid is likely to occur. It is therefore believed that the difference between rates of dissolution of a site exposed with light and a site unexposed with light increases, whereby the MEEF performance is improved. In addition, since the proportion of the polymer (A) present in the surface layer of the resist film is elevated due to the uneven distribution described above, it is believed that the solubility of the surface layer of the resist film in the developing solution is elevated at the site exposed with light. As a consequence, the inhibitory performance of the defects such as bridge is improved.

The polymer (A) preferably further has at least one type of a structure unit (II) selected from the set consisting of a plurality of structure units each represented by the following formulae (2-1) to (2-3).

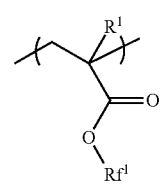

(2-1)

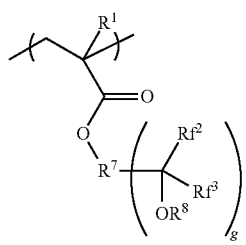

(2-2)

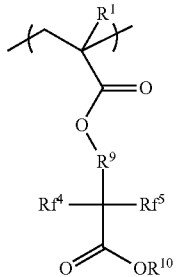

(2-3)

In the formulae (2-1) to (2-3), $R^1$ represents a hydrogen atom, a lower alkyl group or a halogenated lower alkyl group.

In the formula (2-1), $Rf^1$ represents a fluorinated hydrocarbon group having 1 to 30 carbon atoms.

In the formula (2-2), $R^7$ represents a linking group having a valency of (g+1); $R^8$ represents a hydrogen atom or a monovalent organic group; when $R^8$ is present in a plurality of number, the plurality of $R^8$ may be the same or different; $Rf^2$ and $Rf^3$ each independently represent a hydrogen atom, a fluorine atom or a fluorinated hydrocarbon group having 1 to 30 carbon atoms, wherein at least one of $Rf^2$ and $Rf^3$ does not represent a hydrogen atom. $Rf^2$ or $Rf^3$ is present in a plurality of number, the plurality of $Rf^2$ and $Rf^3$ may be each the same or different; g is an integer of 1 to 3.

In the formula (2-3), $R^9$ represents a bivalent linking group; $R^{10}$ represents a hydrogen atom or a monovalent organic group; $Rf^4$ and $Rf^5$ each independently represent a hydrogen atom, a fluorine atom or a fluorinated hydrocarbon group having 1 to 30 carbon atoms, wherein at least one of $Rf^4$ and $Rf^5$ does not represent a hydrogen atom.

Since the polymer (A) further has the aforementioned certain structure unit that includes a fluorine atom, an inhibitory ability of elution of the acid generator and the like present in the resist film into the liquid for liquid immersion lithography, and a receding contact angle between the resist film and the liquid for liquid immersion lithography can be efficiently increased. As a result, occurrence of defects resulting from the liquid for liquid immersion lithography can be further inhibited.

It is preferred that the polymer (A) further has a structure unit that includes at least one type of a group selected from the set consisting of a plurality of groups each represented by the following formulae (4-1) and (4-2) (except for the structure unit represented by the above formula (2-3)).

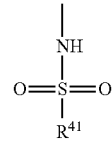

(4-1)

(4-2)

In the formula (4-1), $R^{41}$ represents a hydrocarbon group having 1 to 10 carbon atoms substituted with a fluorine atom.

Since the polymer (A) further has the aforementioned certain structure unit that includes an alkali-soluble group, solubility of the polymer (A) in the developing solution is improved, and as a result, a MEEF performance of the radiation-sensitive resin composition and an inhibitory ability of defects such as bridge can be further improved.

The content of the polymer (A) with respect to 100 parts by mass of the polymer (B) is preferably no less than 0.1 parts by mass and no greater than 20 parts by mass. When the content of the polymer (A) in the radiation-sensitive resin composition falls within this range, uneven distribution of the polymer (A) in the surface layer of the resist film more effectively occurs; therefore, the MEEF performance of the radiation-sensitive resin composition and the inhibitory ability of defects such as bridge can be further enhanced.

The polymer of an embodiment of the present invention has at least one type of a structure unit (I) selected from the set consisting of a plurality of structure units each represented by the following formulae (1-1) and (1-2), and has a content of fluorine atoms of no less than 5% by mass.

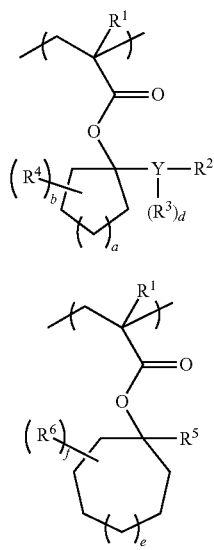

In the formulae (1-1) and (1-2), $R^1$ each independently represents a hydrogen atom, a lower alkyl group or a halogenated lower alkyl group. In the formula (1-1), Y represents a saturated hydrocarbon group having a valency of (2+d); $R^2$ and $R^3$ each independently represent an alkyl group, wherein $R^2$ and $R^3$ may bind with each other to form an alicyclic structure together with Y; $R^4$ represents an alkyl group, an alkoxy group, an acyl group or an acyloxy group; when $R^3$ or $R^4$ is present in a plurality of number, the plurality of $R^3$ and $R^4$ may be the same or different with each other; a part or all of hydrogen atoms of $R^4$ may be substituted; a is 1 or 2; b is an integer of 0 to 3; and d is 1 or 2.

In the formula (1-2), $R^5$ represents an alkyl group; $R^6$ represents an alkyl group, an alkoxy group, an acyl group or an acyloxy group; when $R^6$ is present in a plurality of number, the plurality of $R^6$ may be the same or different; a part or all of hydrogen atoms of $R^6$ may be substituted; e is 1 or 2; and f is an integer of 0 to 5.

It is preferred that the polymer further has at least one type of a structure unit (II) selected from the set consisting of a plurality of structure units each represented by the following formulae (2-1) to (2-3).

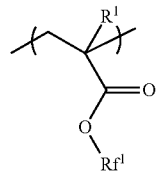

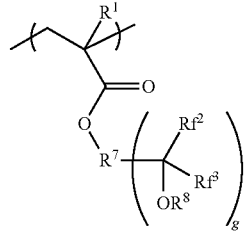

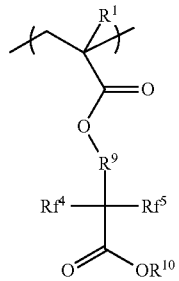

In the formulae (2-1) to (2-3), $R^2$ represents a hydrogen atom, a lower alkyl group or a halogenated lower alkyl group.

In the formula (2-1), $Rf^1$ represents a fluorinated hydrocarbon group having 1 to 30 carbon atoms.

In the formula (2-2), $R^7$ represents a linking group having a valency of (g+1); $R^8$ represents a hydrogen atom or a monovalent organic group; when $R^8$ is present in a plurality of number, the plurality of $R^8$ may be the same or different; $Rf^2$ and $Rf^3$ each independently represent a hydrogen atom, a fluorine atom or a fluorinated hydrocarbon group having 1 to 30 carbon atoms, wherein at least one of $Rf^2$ and $Rf^3$ does not represent a hydrogen atom. $Rf^2$ or $Rf^3$ is present in a plurality of number, the plurality of $Rf^2$ and $Rf^3$ may be each the same or different; g is an integer of 1 to 3.

In the formula (2-3), $R^9$ represents a bivalent linking group; $R^{10}$ represents a hydrogen atom or a monovalent organic group; $Rf^4$ and $Rf^5$ each independently represent a hydrogen atom, a fluorine atom or a fluorinated hydrocarbon group having 1 to 30 carbon atoms, wherein at least one of $Rf^4$ and $Rf^5$ does not represent a hydrogen atom.

It is preferred that the polymer further has a structure unit that includes at least one type of a group selected from the set consisting of groups each represented by the following formulae (4-1) and (4-2) (except for the structure unit represented by the above formula (2-3)).

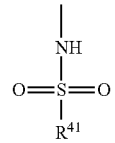

(4-2)

In the formula (4-1), $R^{41}$ represents a hydrocarbon group having 1 to 10 carbon atoms substituted with a fluorine atom.

The polymer has the above structure unit (I), may further have the above structure unit (II), and may still further have the above structure unit (IV). Such a polymer can be unevenly distributed in the surface layer of the resist film due to having a content of fluorine atoms of no less than a certain value, and has a characteristic of being readily dissolved in a developing solution after the action of an acid. Therefore, the polymer is suitable for, e.g., radiation-sensitive resin compositions used in a lithography technique, and the like.

The method for forming a resist pattern of an embodiment of the present invention includes the steps of:

(1) forming a photoresist film on a substrate using the radiation-sensitive resin composition;

(2) subjecting the photoresist film to liquid immersion lithography through a liquid for immersion lithography disposed on the photoresist film; and (3) forming a resist pattern by developing the photoresist film subjected to liquid immersion lithography.

According to the method for forming a resist pattern, since the radiation-sensitive resin composition is used as a photoresist composition, a resist pattern can be obtained which is superior in MEEF performance, accompanied by fewer defects such as bridge.

According to the radiation-sensitive resin composition of the embodiment of the present invention, favorable pattern configuration can be obtained, and favorable MEEF performance can be achieved, with defects such as bridge being less likely to occur. In addition, since the surface of the resist film thus formed is also superior in water repellency and has a high receding contact angle, the radiation-sensitive resin composition can be suitably used for liquid immersion lithography process without forming a protective film additionally on the top face of a resist film. Thus, it is believed that the radiation-sensitive resin composition can be suitably used in lithography techniques for which further miniaturization is expected in the future.

Hereinafter, embodiments for carrying out the present invention are explained; however, the present invention is not limited to the following embodiments. Herein, it is to be noted that the term "(meth)acryl" means acryl and/or methacryl.

<Radiation-Sensitive Resin Composition>

The radiation-sensitive resin composition of the embodiment of the present invention contains (A) a polymer (B) a polymer and (C) an acid generator. Furthermore, the radiation-sensitive resin composition may contain an optional component in the range not accompanied by deterioration of effects of the invention. The radiation-sensitive resin composition enables favorable pattern configuration to be obtained, and favorable MEEF performance can be achieved, with bridge defects and the like being less likely to occur. Hereinafter, each of constitutive components is explained.

<(A) Polymer>

The polymer (A) has at least one type of a structure unit (I) selected from the set consisting of a plurality of structure units represented by the above formulae (1-1) and (1-2), and has a content of fluorine atoms of no less than 5% by mass. Since the polymer (A) contains a certain amount or more fluorine atoms, when a resist film is formed from the radiation-sensitive resin composition, distribution of the polymer (A) in the film is likely to increase on the surface of the resist film due to the oil repellent characteristic feature of the same. Therefore, elution of an acid generator, an acid diffusion control agent and the like present in the resist film into a liquid for liquid immersion lithography such as water can be inhibited during liquid immersion lithography. On the other hand, since the polymer containing a fluorine atom is generally likely to have low solubility in a developing solution, uneven distribution of such a polymer in the surface layer of the resist film is believed to account for one factor of generation of bridge defects. However, according to the radiation-sensitive resin composition containing the polymer (A), defects such as bridge are less likely to occur. This event is believed to result from the acid-dissociable group of the structure unit (I) being more likely to be dissociated by an acid, consequently leading to possibility of increase in the solubility of the polymer (A) present at the site exposed with light into the developing solution.

<Structure Unit (I)>

The structure unit (I) is at least one type of a structure unit selected from the set consisting of a plurality of structure units each represented by the above formulae (1-1) and (1-2).

In the above formulae (1-1) and (1-2), $R^1$ each independently represents a hydrogen atom, a lower alkyl group or a halogenated lower alkyl group. In the above formula (1-1), Y represents a saturated hydrocarbon group having a valency of (2+d); $R^2$ and $R^3$ each independently represent an alkyl group, wherein $R^2$ and $R^3$ may bind with each other to form an alicyclic structure together with Y; $R^4$ represents an alkyl group, an alkoxy group, an acyl group or an acyloxy group; $R^3$ or $R^4$ is present in a plurality of number, the plurality of $R^3$ and $R^4$ may be the same or different with each other; a part or all of hydrogen atoms of $R^4$ may be substituted; a is 1 or 2; b is an integer of 0 to 3; and d is 1 or 2. In the above formula (1-2), $R^5$ represents an alkyl group; $R^6$ represents an alkyl group, an alkoxy group, an acyl group or an acyloxy group; $R^6$ is present in a plurality of number, the plurality of $R^6$ may be the same or different; a part or all of hydrogen atoms of $R^6$ may be substituted; e is 1 or 2; and f is an integer of 0 to 5.

The lower alkyl group represented by $R^1$ is preferably an alkyl group having 1 to 4 carbon atoms, and may be, for example, a methyl group, an ethyl group, a 1-propyl group, a 2-propyl group, a 1-butyl group, a 2-butyl group, a 2-(2-methylpropyl) group, and the like. Of these, a methyl group is particularly preferred.

The halogenated lower alkyl group represented by $R^1$ is preferably an alkyl group having 1 to 4 carbon atoms having a halogen atom. Examples of the halogen atom include a fluorine atom, a chlorine atom, bromine atom, iodine atom, and the like. Examples of the halogenated lower alkyl group include a fluoromethyl group, a difluoromethyl group, a trifluoromethyl group, a perfluoroethyl group, a perfluoropropyl group, a perfluorobutyl group, a trichloromethyl group, a tribromomethyl group, a triiodomethyl group, and the like. Of these, a fluorinated alkyl group having 1 to 4 carbon atoms is preferred, and a trifluoromethyl group is more preferred.

The alkyl group represented by $R^2$ and $R^3$, $R^4$ and $R^6$, and $R^5$ is exemplified by linear or branched alkyl groups having 1 to 10 carbon atoms such as a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, and a 3-(3-methylpentyl) group; and cyclic alkyl group having 4 to 20 carbon atoms such as a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl group), a cycloheptyl group, a cycloheptylmethyl group, a 1-(1-cycloheptylethyl) group, a 1-(2-cycloheptylethyl) group, and a 2-norbornyl group.

Of the aforementioned alkyl groups, $R^2$ is preferably a methyl group, an ethyl group and a propyl group, and a methyl group is more preferred. $R^3$ is preferably a methyl group and an ethyl group, and a methyl group is more preferred. $R^5$ is preferably a linear or branched alkyl group having 1 to 4 carbon atoms, more preferably a methyl group, an ethyl group, a n-propyl group, an i-propyl group and a n-butyl group, and still more preferably a methyl group and an ethyl group. $R^4$ and $R^6$ are preferably a methyl group and an ethyl group, and a methyl group is more preferred.

Examples of the alkoxy group represented by $R^4$ and $R^6$ include alkoxy groups having 1 to 10 carbon atoms such as a methoxy group, an ethoxy group, a n-butoxy group, a t-butoxy group, a propoxy group and an isopropoxy group.

Examples of the acyl group represented by $R^4$ and $R^6$ include acyl groups having 1 to 10 carbon atoms such as an acetyl group, an ethylcarbonyl group, and a propylcarbonyl group.

Examples of the acyloxy group represented by $R^4$ and $R^6$ include acyloxy groups having 1 to 10 carbon atoms such as an acetoxy group, an ethylyloxy group, a butyryloxy group, a t-butyryloxy group, a t-amylyloxy group, a n-hexanecarbonyloxy group, and a n-octanecarbonyloxy group.

Examples of the saturated hydrocarbon group having a valency of (2+d) represented by Y include groups obtained by removing (1+d) hydrogen atoms from the linear, branched or cyclic alkyl groups described above. Among these, a methanediyl group and a methanetriyl group are preferred, and a methanediyl group is more preferred. Although d is 1 or 2, it is more preferred that d is 1.

The alicyclic structure formed by binding of $R^2$ and $R^3$ with each other together with Y is exemplified by an ethylcyclopentane structure, a cyclohexane structure, a methylcyclohexane structure, an ethylcyclohexane structure, a cycloheptane structure, a methylcycloheptane structure, an ethylcycloheptane structure, a norbornane structure, and the like.

The substituent which may be included in $R^4$ and $R^6$ is exemplified by a halogen atom such as a cyano group, a fluorine atom, a chlorine atom or a bromine atom, a phenyl group, a hydroxyl group, an acyloxy group, an alkoxy group, and the like.

Examples of the group formed from $R^2$, $R^3$ and Y include secondary alkyl groups such as a 2-propyl group, a 2-butyl group, a 2-pentyl group, a 3-pentyl group, a 2-hexyl group, and a 3-hexyl group; tertiary alkyl groups such as a 1,1-dimethyl ethyl group, a 1,1-dimethylpropyl group, and 1-ethyl-1-methylpropyl group, and the like. Of these, in light of enhanced ease in dissociation of the acid-dissociable group carried by the structure unit (I-1), a 2-propyl group, a 2-butyl group, a 1,1-dimethyl ethyl group and a 1,1-dimethylpropyl group are preferred, a 2-propyl group and a 2-butyl group are more preferred, and a 2-propyl group is particularly preferred.

Specific examples of the monomer that can give the aforementioned structure unit (I) include (meth)acrylic acid 1-isopropyl-1-cyclopentyl ester, (meth)acrylic acid 1-t-butyl-1-cyclopentyl ester, (meth)acrylic acid 1-isopropyl-1-cyclohexyl ester, (meth)acrylic acid 1-t-butyl-1-cyclohexyl ester, (meth)acrylic acid 1-methyl-1-cycloheptyl ester, (meth)acrylic acid 1-ethyl-1-cycloheptyl ester, (meth)acrylic acid 1-isopropyl-1-cycloheptyl ester, (meth)acrylic acid 1-t-butyl-1-cycloheptyl ester, (meth)acrylic acid 1-methyl-1-cyclooctyl ester, (meth)acrylic acid 1-ethyl-1-cyclooctyl ester, (meth)acrylic acid 1-isopropyl-1-cyclooctyl ester, (meth)acrylic acid 1-propyl-1-cyclooctyl ester, (meth)acrylic acid 1-n-butyl-1-cyclooctyl ester, (meth)acrylic acid 1-t-butyl-1-cyclooctyl ester, and the like.

Among these monomers, (meth)acrylic acid 1-isopropyl-1-cyclopentyl ester, (meth)acrylic acid 1-methyl-1-cycloheptyl ester, (meth)acrylic acid 1-ethyl-1-cycloheptyl ester, (meth)acrylic acid 1-methyl-1-cyclooctyl ester, and (meth)acrylic acid 1-ethyl-1-cyclooctyl ester are preferred.

The polymer (A) may include either only one type or at least two types of the structure unit (I).

<Structure Unit (II)>

The polymer (A) may further have in addition to the structure unit (I) at least one type of the structure unit (II) having a fluorine atom selected from the set consisting of a plurality of structure units each represented by the above formulae (2-1) to (2-3). Due to the polymer (A) having the structure unit (II), elution of an acid generator, an acid diffusion control agent and the like present in the resist film into a liquid for liquid immersion lithography can be inhibited, and due to increase in the receding contact angle between the resist film and the liquid for liquid immersion lithography, droplets of the liquid for liquid immersion lithography are less likely to remain on the resist film, whereby occurrence of defects resulting from the liquid for liquid immersion lithography can be consequently inhibited.

[Structure Unit (II-1)]

The structure unit (II-1) is represented by the above formula (2-1).

In the above formula (2-1), $R^1$ represents a hydrogen atom, a lower alkyl group or a halogenated lower alkyl group. In the formula (2-1), $Rf^1$ represents a fluorinated hydrocarbon group having 1 to 30 carbon atoms.

Examples of the lower alkyl group and the halogenated lower alkyl group represented by $R^1$ include examples of $R^1$ of the above formulae (1-1) and (1-2).

Examples of the fluorinated hydrocarbon group having 1 to 30 carbon atoms represented by $Rf^1$ include linear or branched alkyl groups having 1 to 6 carbon atoms substituted with at least one fluorine atom, monovalent alicyclic hydrocarbon group having 4 to 20 carbon atoms substituted with at least one fluorine atom or groups derived therefrom.

Examples of the linear or branched alkyl group having 1 to 6 carbon atoms substituted with at least one fluorine atom include linear or branched alkyl groups such as a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl)

group, a 2-(3-methylpentyl) group, a 2-(4-methylpentyl) group, a 3-(2-methylpentyl) group, and a 3-(3-methylpentyl) group, which were partially fluorinated or perfluorinated, and the like.

Examples of the monovalent alicyclic hydrocarbon group having 4 to 20 carbon atoms substituted with at least one fluorine atom represented by $Rf^1$ or groups derived therefrom include groups such as a cyclopentyl group, cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl group), a cycloheptyl group, a cycloheptylmethyl group, a 1-(1-cycloheptylethyl) group, a 1-(2-cycloheptylethyl) group and a 2-norbornyl group, which have a partially fluorinated or e perfluorinated alicyclic hydrocarbon group, and the like.

Examples of preferable monomers that can give the above structure unit (II-1) include (meth)acrylic acid trifluoromethyl ester, (meth)acrylic acid 2,2,2-trifluoroethyl ester, (meth)acrylic acid perfluoroethyl ester, (meth)acrylic acid perfluoro n-propyl ester, (meth)acrylic acid perfluoro i-propyl ester, (meth)acrylic acid perfluoro n-butyl ester, (meth)acrylic acid perfluoro i-butyl ester, (meth)acrylic acid perfluoro t-butyl ester, (meth)acrylic acid 2-(1,1,1,3,3,3-hexafluoropropyl)ester, (meth)acrylic acid 1-(2,2,3,3,4,4,5,5-octafluoropentyl)ester, (meth)acrylic acid perfluorocyclohexylmethyl ester, (meth)acrylic acid 1-(2,2,3,3,3-pentafluoropropyl)ester, (meth)acrylic acid 1-(3,3,4,4,5,5,6,6,7,7,8,8,9,9,10,10,10-heptadecafluorodecyl) ester, (meth)acrylic acid 1-(5-trifluoromethyl-3,3,4,4,5,6,6,6-octafluorohexyl)ester, and the like.

[Structure Units (II-2) and (II-3)]

In the formulae (2-2) to (2-3), $R^2$ represents a hydrogen atom, a lower alkyl group or a halogenated lower alkyl group. In the above formula (2-2), $R^7$ represents a linking group having a valency of (g+1); $R^8$ represents a hydrogen atom or a monovalent organic group; when $R^8$ is present in a plurality of number, the plurality of $R^8$ may be the same or different; $Rf^2$ and $Rf^3$ each independently represent a hydrogen atom, a fluorine atom or a fluorinated hydrocarbon group having 1 to 30 carbon atoms, wherein at least one of $Rf^2$ and $Rf^3$ does not represent a hydrogen atom. $Rf^2$ or $Rf^3$ is present in a plurality of number, the plurality of $Rf^2$ and $Rf^3$ may be each the same or different; g is an integer of 1 to 3.

In the above formula (2-3), $R^9$ represents a bivalent linking group; $R^{10}$ represents a hydrogen atom or a monovalent organic group; $Rf^4$ and $Rf^5$ each independently represent a hydrogen atom, a fluorine atom or a fluorinated hydrocarbon group having 1 to 30 carbon atoms, wherein at least one of $Rf^4$ and $Rf^5$ does not represent a hydrogen atom.

In the above formulae (2-2) and (2-3), $R^8$ and $R^{10}$ represent a hydrogen atom or a monovalent organic group, and the monovalent organic group is exemplified by monovalent hydrocarbon groups having 1 to 30 carbon atoms, acid-dissociable groups, and alkali-dissociable groups.

The monovalent hydrocarbon group having 1 to 30 carbon atoms is exemplified by linear or branched monovalent hydrocarbon groups having 1 to 10 carbon atoms, and monovalent cyclic hydrocarbon groups having 3 to 30 carbon atoms. Details of these hydrocarbon groups are as defined entirely in connection with $R^4$ and $R^6$ of the above formula (1-1); however, those corresponding to the acid-dissociable groups and alkali-dissociable groups described later are excluded.

In addition, the hydrocarbon group may have a substituent. Examples of the substituent include exemplary substituents which may be included in $R^4$ and $R^6$ of the above formula (1-1).

The "acid-dissociable group" as referred to means a group that substitutes for, for example, a hydrogen atom in a polar functional group such as a hydroxyl group or a carboxyl group, and that dissociates in the presence of an acid.

Specific examples of the acid-dissociable group represented by $R^8$ and $R^{10}$ include a t-butoxycarbonyl group, a tetrahydropyranyl group, a tetrahydrofuranyl group, a (thiotetrahydropyranylsulfanil)methyl group, a (thiotetrahydrofuranylsulfanil)methyl group, an alkoxy substituted methyl group, an alkylsulfanil substituted methyl group, and the like. As the alkoxy group (substituent) in the alkoxy substituted methyl group is exemplified by an alkoxy group having 1 to 4 carbon atoms. Also, the alkyl group (substituent) in the alkylsulfanil substituted methyl group is exemplified by an alkyl group having 1 to 4 carbon atoms.

Furthermore, the acid-dissociable group is exemplified by a group represented by a formula [—C(R)₃]. It is to be noted that in this formula, three R each independently represent a linear or branched alkyl group having 1 to 4 carbon atoms, a monovalent alicyclic hydrocarbon group having 4 to 20 carbon atom or a group derived therefrom, or any two of R bind with each other to form a bivalent alicyclic hydrocarbon group having 4 to 20 carbon atoms together with the carbon atom to which the two are each attached or a group derived therefrom, with the remaining one R being a linear or branched alkyl group having 1 to 4 carbon atoms, a monovalent alicyclic hydrocarbon group having 4 to 20 carbon atom or a group derived therefrom.

The linear or branched alkyl group having 1 to 4 carbon atoms represented by R in the acid-dissociable group represented by the above formula [—C(R)₃] may be, for example, a methyl group, an ethyl group, a n-propyl group, an i-propyl group, a n-butyl group, a 2-methylpropyl group, a 1-methylpropyl group, a t-butyl group, and the like.

Examples of the monovalent alicyclic hydrocarbon group having 4 to 20 carbon atom represented by R include cycloalkanes such as norbornane, tricyclodecane, tetracyclododecane, adamantane, cyclobutane, cyclopentane, cyclohexane, cycloheptane and cyclooctane from which one hydrogen atom was removed, and the like.

The group derived from the alicyclic hydrocarbon group is exemplified by groups obtained by substituting a part or all of hydrogen atoms of the monovalent alicyclic hydrocarbon group described above with at least one or at least one types of, for example, a linear, branched alkyl group having 1 to 4 carbon atoms such as a methyl group, an ethyl group, a n-propyl group, an i-propyl group, a n-butyl group, a 2-methylpropyl group, a 1-methylpropyl group, or a t-butyl group or a cyclic alkyl group having 4 to 20 carbon atoms.

Among these, the alicyclic hydrocarbon group represented by R is preferably an alicyclic hydrocarbon group formed from an alicyclic ring derived from norbornane, tricyclodecane, tetracyclododecane, adamantane, cyclopentane or cyclohexane, or a group obtained by substituting a part or all of hydrogen atoms of this alicyclic hydrocarbon group with the alkyl group described above.

In addition, examples of the bivalent alicyclic hydrocarbon group having 4 to 20 carbon atoms formed by binding of any of two R with each other together with the carbon atom to which they are each attached (carbon atom attached to an oxygen atom) include monocyclic hydrocarbon groups such as a cyclobutanediyl group, a cyclopentanediyl group, a cyclohexanediyl group and a cyclooctanediyl group, polycyclic hydrocarbon groups such as a norbornanediyl group, a tricyclodecanediyl group and a tetracyclodecanediyl group, crosslinked polycyclic hydrocarbon groups such as an adamantanediyl group.

Furthermore, the group derived from the bivalent alicyclic hydrocarbon group formed by binding of R with each other is exemplified by groups obtained by substituting a part or all of hydrogen atoms of the bivalent alicyclic hydrocarbon group described above with at least one or at least one types of, for example, a linear, branched alkyl group having 1 to 4 carbon atoms or cyclic alkyl group having 4 to 20 carbon atoms such as a methyl group, an ethyl group, a n-propyl group, an i-propyl group, a n-butyl group, a 2-methylpropyl group, a 1-methylpropyl group or a t-butyl group, and the like.

Among these, monocyclic hydrocarbon groups such as a cyclopentanediyl group and a cyclohexanediyl group, and groups obtained by substituting the bivalent alicyclic hydrocarbon group (monocyclic hydrocarbon group) with the alkyl group described above are preferred.

Herein, examples of preferable acid-dissociable group represented by the above formula [—C(R)$_3$] include groups obtained by substituting a t-butyl group, a 1-n-(1-ethyl-1-methyl)propyl group, a 1-n-(1,1-dimethyl)propyl group, a 1-n-(1,1-dimethyl)butyl group, a 1-n-(1,1-dimethyl)pentyl group, a 1-(1,1-diethyl)propyl group, a 1-n-(1,1-diethyl)butyl group, a 1-n-(1,1-diethyl)pentyl group, a 1-(1-methyl)cyclopentyl group, a 1-(1-ethyl)cyclopentyl group, a 1-(1-n-propyl)cyclopentyl group, a 1-(1-i-propyl)cyclopentyl group, a 1-(1-methyl)cyclohexyl group, a 1-(1-ethyl)cyclohexyl group, a 1-(1-n-propyl)cyclohexyl group, a 1-(1-i-propyl)cyclohexyl group, a 1-[1-methyl-1-(2-norbornyl)]ethyl group, a 1-[1-methyl-1-(2-tetracyclodecanyl)]ethyl group, a 1-[1-methyl-1-(1-adamantyl)]ethyl group, a 2-(2-methyl)norbornyl group, a 2-(2-ethyl)norbornyl group, a 2-(2-n-propyl)norbornyl group, a 2-(2-i-propyl)norbornyl group, a 2-(2-methyl)tetracyclododecanyl group, a 2-(2-ethyl)tetracyclododecanyl group, a 2-(2-n-propyl)tetracyclododecanyl group, a 2-(2-i-propyl)tetracyclododecanyl group, a 2-(2-methyl)adamantyl group, a 2-(2-ethyl)adamantyl group, a 2-(2-n-propyl)adamantyl group or a 2-(2-i-propyl)adamantyl group, and groups obtained by substituting groups including the alicyclic ring with at least one or at least one types of, for example, a linear or branched alkyl group having 1 to 4 carbon atoms such as a methyl group, an ethyl group, a n-propyl group, an i-propyl group, a n-butyl group, a 2-methylpropyl group, a 1-methylpropyl group or a t-butyl group, or a cyclic alkyl group having 4 to 20 carbon atoms, and the like.

Also, of these acid-dissociable groups, groups represented by the formula of: [—C(R)$_3$], a t-butoxycarbonyl group, and alkoxy substituted methyl groups and the like are preferred. In particular, a t-butoxycarbonyl group, and an alkoxy substituted methyl group are preferred in the structure unit (2-2). In the structure unit (2-3), an alkoxy substituted methyl group, and groups represented by the formula of [—C(R)$_3$] are preferred.

Use of the structure unit (II-2) and/or the structure unit (II-3) having the acid-dissociable group is preferred since solubility of the polymer (A) at a patterning light exposed site can be increased. This increase is believed to result from a polar group yielded by a reaction with an acid generated at the site exposed with light of the resist film in the exposure step in the method for forming a resist pattern described later.

The "alkali-dissociable group" as referred to means a group that substitutes for, for example, a hydrogen atom in a polar functional group such as a hydroxyl group or a carboxyl group, and that dissociates in the presence of an alkali.

The alkali-dissociable group represented by $R^8$ and $R^{10}$ is not particularly limited as long as the aforementioned properties are exhibited, and in the above general formula (2-2), the alkali-dissociable group represented by the following formula (R2-1) may be exemplified.

(R2-1)

In the above formula (R2-1), $R^{21}$ represents a hydrocarbon group having 1 to 10 carbon atoms in which at least one hydrogen atom is substituted with a fluorine atom. Details of $R^{21}$ are as defined in connection with $Rf^1$ described above.

$R^{21}$ is preferably a linear or branched perfluoroalkyl group having 1 to 10 carbon atoms in which all hydrogen atoms of the hydrocarbon group are substituted with a fluorine atom, and particularly preferably a trifluoromethyl group.

Also, in the above formula (2-3), the alkali-dissociable group may be exemplified by groups each represented by the following formulae (R2-2) to (R2-4).

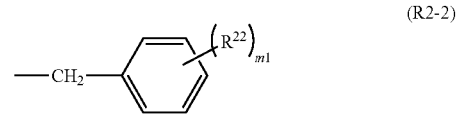
(R2-2)

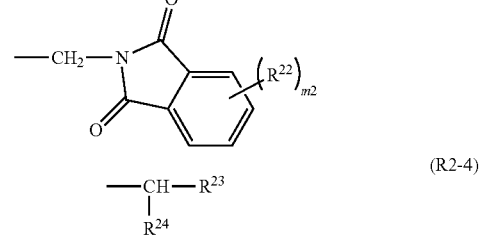
(R2-3)

(R2-4)

In the above formulae (R2-2) and (R2-3), $R^{22}$ represents a halogen atom, or an alkyl group, an alkoxy group, acyl group or an acyloxy group having 1 to 10 carbon atoms; $m_1$ is an integer of 0 to 5; $m_2$ is an integer of 0 to 4; and when $R^{22}$ is present in a plurality of number, they may be the same or different.

In the above formula (R2-4), $R^{23}$ and $R^{24}$ each independently represent a hydrogen atom or an alkyl group having 1 to 10 carbon atoms, or $R^{23}$ and $R^{24}$ may bind with each other to form an alicyclic structure having 4 to 20 carbon atoms.

In the above formulae (R2-2) and (R2-3), examples of the halogen atom represented by $R^{10}$ include a fluorine atom, a chlorine atom, a bromine atom, an iodine atom, and the like. Of these, a fluorine atom is preferred.

In the above formulae (R2-2) and (R2-3), the alkyl group, the alkoxy group, the acyl group, and details of the acyloxy group having 1 to 10 carbon atoms represented by $R^{10}$ are as defined in connection with $R^4$ and $R^6$ in the above formula (1-1).

In the above formula (R2-4), the alkyl group having 1 to 10 carbon atoms represented by $R^{23}$ or $R^{24}$ may be the same as the alkyl group exemplified above in connection with $R^{22}$.

Examples of the alicyclic structure formed by binding of $R^{23}$ and $R^{24}$ with each other together with the carbon atom to which they are each attached include a cyclopentane structure, a methylcyclopentane structure, an ethylcyclopentane structure, a cyclohexane structure, a methylcyclohexane structure, an ethylcyclohexane structure, an ethylcyclohexane structure, a cycloheptane structure, a methylcycloheptane structure, an ethylcycloheptane structure, a norbornane structure, and the like.

Specific examples of the group represented by the above formula (R2-4) include a methyl group, an ethyl group, a 1-propyl group, a 2-propyl group, a 1-butyl group, a 2-butyl group, a 1-pentyl group, a 2-pentyl group, a 3-pentyl group, a 1-(2-methylbutyl) group, a 1-(3-methylbutyl) group, a 2-(3-methylbutyl) group, neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(3-methylpentyl) group, a 2-(4-methylpentyl) group, a 3-(2-methylpentyl) group, and the like. Among these, a methyl group, an ethyl group, a 1-propyl group, a 2-propyl group, a 1-butyl group, and a 2-butyl group are preferred.

Including in the polymer (A) the structure unit (II-2) and/or the structure unit (II-3) having the alkali-dissociable group is preferred since affinity of the polymer (A) to the developing solution can be improved. This improvement is believed to result from a polar group yielded by a reaction of the polymer (A) with the developing solution in the development step of the method for forming a pattern described later.

In the above formulae (2-2) and (2-3), when $R^8$ or $R^{10}$ represents a hydrogen atom, the structure units (II-2) and (II-3) the have a hydroxyl group or a carboxyl group that is a polar group. Including such structure units in the polymer (A) enables the affinity of the polymer (A) to the developing solution in the development step of the method for forming a pattern described later to be improved.

In the above formula (2-2), $R^7$ represents a linking group having a valency of (g+1). Such a linking group is exemplified by a single bond, or hydrocarbon group having a valency of (g+1) and 1 to 30 carbon atoms. In addition, the linking group may be exemplified by groups derived by combining such a hydrocarbon group with an oxygen atom, a sulfur atom, an imino group, a carbonyl group, —CO—O— or —CO—NH—. "g" is an integer of 1 to 3. When g is 2 or 3, the structure represented by the formula of:

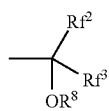

(a1)

in the above formula (2-2) is each independent.

Examples of $R^7$ having a chain structure include chain hydrocarbon groups having a valency of (g+1), the structure of which is derived by removing (g+1) hydrogen atoms from a chain hydrocarbon having 1 to 10 carbon atoms such as methane, ethane, propane, butane, 2-methylpropane, pentane, 2-methylbutane, 2,2-dimethylpropane, hexane, heptane, octane, nonane or decane, and the like.

Examples of $R^7$ having a cyclic structure include alicyclic hydrocarbon groups having a valency of (g+1), the structure of which is derived by removing (g+1) hydrogen atoms from an alicyclic hydrocarbon having 4 to 20 carbon atoms such as cyclobutane, cyclopentane, cyclohexane, bicyclo[2.2.1]heptane, bicyclo[2.2.2]octane, tricyclo[5.2.1.0$^{2,6}$]decane or tricyclo[3.3.1.1$^{3,7}$]decane; aromatic hydrocarbon groups having a valency of (g+1), the structure of which is derived by removing (g+1) hydrogen atoms from an aromatic hydrocarbon having 6 to 30 carbon atoms such as benzene or naphthalene, and the like.

Also, examples of the group derived by combining such a hydrocarbon group with an oxygen atom, a sulfur atom, an imino group, a carbonyl group, —CO—O— or —CO—NH— include groups represented by the following formulae.

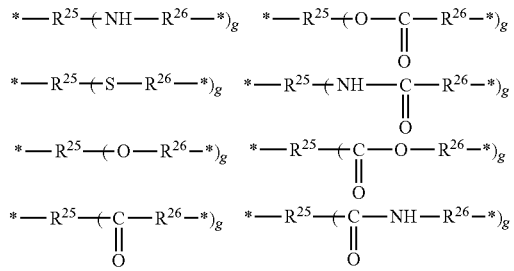

In the above formula, $R^{25}$ and $R^{26}$ each independently represent a single bond, a bivalent chain hydrocarbon group having 1 to 10 carbon atoms, bivalent cyclic hydrocarbon group having 4 to 20 carbon atoms or a bivalent aromatic hydrocarbon group having 6 to 30 carbon atoms. "g" is as defined in connection with the above formula (2-2).

Details of the bivalent chain hydrocarbon group having 1 to 10 carbon atoms, the bivalent cyclic hydrocarbon group having 4 to 20 carbon atoms, and the bivalent aromatic hydrocarbon group having 6 to 30 carbon atoms represented by $R^{25}$ and $R^{26}$ are as defined entirely in connection with $R^7$ described above.

$R^7$ may have a substituent. Examples of such a substituent include exemplary substituents which may be included in $R^4$ and $R^6$ of the above formulae (1-1) and (1-2).

Details of the bivalent linking group represented by $R^9$ of the above formula (2-3) are as defined in connection with $R^7$ when g is 1.

In the above formula (2-2) and (2-3), $Rf^2$ to $Rf^5$ each independently represent a hydrogen atom, a fluorine atom or a fluorinated hydrocarbon group having 1 to 30 carbon atoms, wherein at least one of $Rf^2$ and $Rf^3$ does not represent a hydrogen atom, and also at least one of $Rf^4$ and $Rf^5$ does not represent a hydrogen atom. Details of the fluorinated hydrocarbon group having 1 to 30 carbon atoms represented by $Rf^2$ to $Rf^5$ are as defined entirely in connection with $Rf^1$ in the above formula (2-1).

Examples of the partial structure represented by the following formula (b1) in the above formula (2-2), and the partial structure represented by the formula (b2) in the formula (2-3) include those represented by the following formulae (b-1) to (b-5). Among these, in the above formula (2-2), a partial structure represented by the following formula (b-5) is preferred, whereas in the above formula (2-3), a partial structure represented by the following formula (b-3) is preferred.

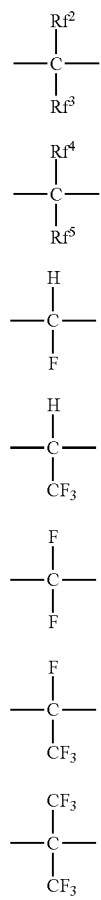

(b1)

(b2)

(b-1)

(b-2)

(b-3)

(b-4)

(b-5)

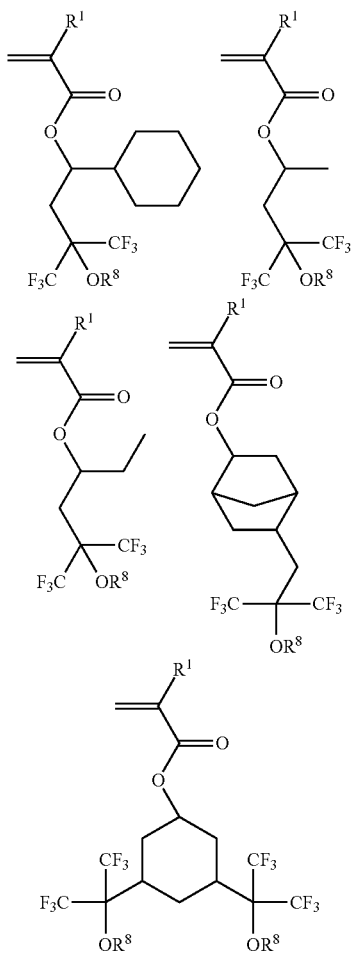

Specific examples of the structure unit (II-2) include those represented by the following formulae (2-2-1) and (2-2-2).

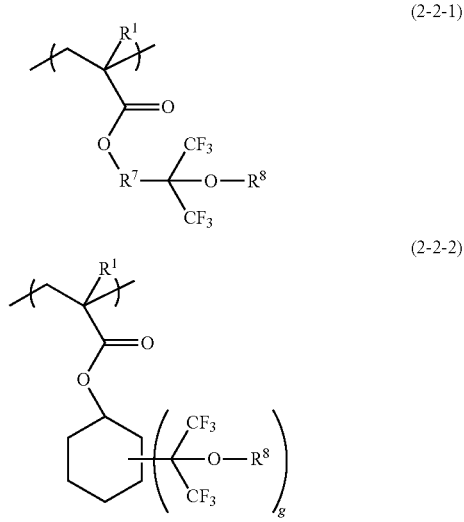

In the above formulae (2-2-1) and (2-2-2), $R^1$, $R^7$, $R^8$ and g are as defined in connection with the above formula (2-2). Examples of the monomer that can give such a structure unit include those represented by the following formulae.

In the above formulae, $R^1$, and $R^8$ are as defined in connection with the above formula (2-2).

In the above formulae, monomers in which $R^8$ represents an acid-dissociable group or an alkali-dissociable group can be synthesized using as a basic material, for example, a compound in which $R^8$ is a hydrogen atom in each of the above formula. With respect to a compound in this $R^8$ is represented by the above formula (R2-1) as an example, the compound can be synthesized by subjecting a compound in which $R^8$ is a hydrogen atom in each formula to fluoroacylation with a conventionally well-known method. For example, the synthesis method may involve 1) esterification by allowing an alcohol and a fluorocarboxylic acid to be condensed in the presence of an acid, 2) esterification by allowing an alcohol and a fluorocarboxylic halide to be condensed in the presence of a base, and the like.

A specific example of the structure unit (II-3) may include one represented by the following formula.

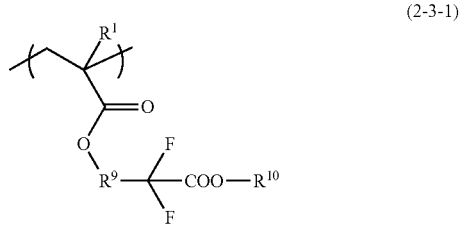

In the above formula (2-3-1), $R^1$, $R^9$ and $R^{10}$ are as defined in connection with the above formula (2-3). Examples of the monomer that can give such a structure unit include those represented by the following formulae.

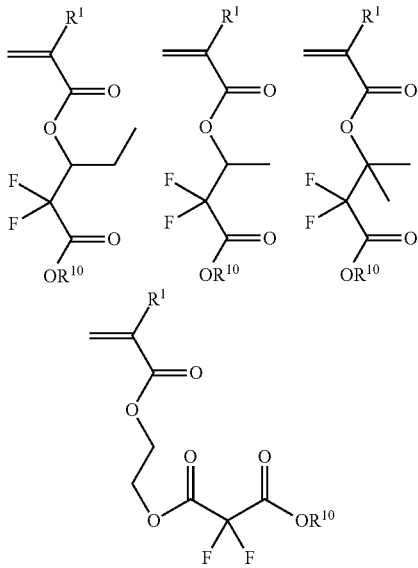

In the above formulae, $R^1$ and $R^{10}$ are as defined in connection with the above formula (2-3).

In the above formulae, the monomer in which $R^{10}$ represents an acid-dissociable group or an alkali-dissociable group can be synthesized using as a basic material, for example a compound represented by the above formula in which $R^{10}$ represents a hydrogen atom, or a derivative of the same. By way of example, with respect to the compounds in which $R^{10}$ is represented by the above formulae (2-2) to (2-4), these compounds can be obtained by allowing, for example, a compound represented by the following formula (m-2-3) to react with a compound each represented by the following formulae (m-2-4-1) to (m-2-4-3).

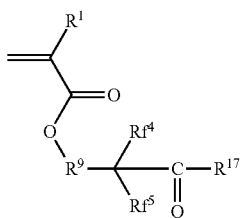
(m-2-3)

In the above formula (m-2-3), $R^1$, $R^9$, $Rf^4$ and $Rf^5$ are as defined in connection with the above formula (2-3); and $R^{17}$ represents a hydroxyl group or a halogen atom.

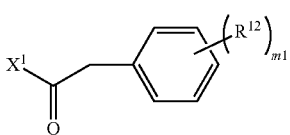
(m-2-4-1)

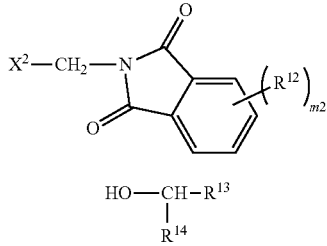
(m-2-4-2)

(m-2-4-3)

HO—CH—$R^{13}$
       |
       $R^{14}$

In the above formulae (m-2-4-1) and (m-2-4-2), $R^{12}$ is as defined in connection with the formula (R2-2).

In the above formula (m-2-4-1), $X^1$ represents a halogen atom, and preferably a chlorine atom; and m1 is an integer of 0 to 5.

In the above formula (m-2-4-2), $X^2$ represents halogen atom, and preferably a bromine atom; and m2 is an integer of 0 to 4.

Also, the monomer in which $R^{10}$ represents an acid-dissociable group or an alkali-dissociable group can be obtained by allowing a compound represented by the following formula (m-2-5) to react with a compound represented by the following formula (m-2-6).

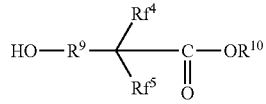
(m-2-5)

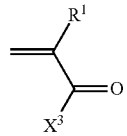
(m-2-6)

In the above formula (m-2-5), $R^7$, $R^{10}$, $Rf^4$ and $Rf^5$ are as defined in connection with the formula (2-3).

In the above formula (m-2-6), $R^1$ is as defined in connection with the formula (2-3). $X^3$ represents a hydroxyl group or a halogen atom.

The polymer (A) may include either only one type or at least two types of the structure units (II-1) to (II-3), preferably includes at least two types of the structure units (II-1) to (II-3), and particularly preferably includes a combination of the structure unit (II-2) and the structure unit (II-3).

It is preferred that the polymer (A) further includes in addition to the structure units (I) and (II), a structure unit having an acid-dissociable group other than the structure unit (I) (hereinafter, may be also referred to as "structure unit (III)"), a structure unit having an alkali-soluble group (except for those corresponding to the structure unit (II-3)) (hereinafter, may be also referred to as "structure unit (IV)"), or a structure unit having an alkali-reactive group (except for those corresponding to the structure unit (II-3)) (hereinafter, may be also referred to as "structure unit (V)").

<Structure Unit (III)>

The structure unit (III) is a structure unit having an acid-dissociable group other than the structure unit (I). Due to the polymer (A) having the structure unit (III), adjustment of solubility in the developing solution after exposure is enabled. The structure unit (III) is preferably, for example, a structure unit represented by the following formula (3).

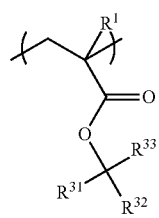

(3)

In the above formula (3), $R^1$ represents a hydrogen atom, a lower alkyl group or a halogenated lower alkyl group; $R^{31}$ to $R^{33}$ each independently represent a linear or branched alkyl group having 1 to 4 carbon atoms, or a monovalent alicyclic hydrocarbon group having 4 to 20 carbon atom or groups derived therefrom, wherein $R^{31}$ and $R^{32}$ may bind with each other to form a bivalent alicyclic hydrocarbon group having 4 to 20 carbon atoms together with the carbon atom to which they are each attached, or a group derived therefrom, and $R^{23}$ may be a linear or branched alkyl group having 1 to 4 carbon atoms, or a monovalent alicyclic hydrocarbon group having 4 to 20 carbon atom or a group derived therefrom. However, the structure unit represented by the above formula (1-1) or (1-2) should be excluded from the structure unit represented by the above formula (3).

Examples of the $R^1$ include those of $R^1$ in the above formulae (1-1) and (1-2).

Examples of the alkyl group having 1 to 4 carbon atoms represented by $R^{31}$ to $R^{33}$ include a methyl group, an ethyl group, a n-propyl group, an i-propyl group, a n-butyl group, a 2-methylpropyl group, a 1-methylpropyl group, a t-butyl group, and the like. Also, examples of the monovalent alicyclic hydrocarbon group having 4 to 20 carbon atom represented by $R^{31}$ to $R^{33}$, and the bivalent alicyclic hydrocarbon group having 4 to 20 carbon atoms formed by binding of $R^{31}$ and $R^{32}$ with each other together with the carbon atom to which they are each attached include groups having a bridged skeleton such as an adamantane skeleton, a norbornane skeleton, a tricyclodecane skeleton or a tetracyclododecane skeleton, a cycloalkane skeleton such as a cyclobutane, cyclopentane, cyclohexane, cycloheptane or cyclooctane skeleton; groups obtained by substituting a part or all of hydrogen atoms of these groups with at least one or at least one types of, for example, a linear or branched alkyl group having 1 to 10 carbon atoms such as a methyl group, an ethyl group, a n-propyl group, an i-propyl group, a n-butyl group, a 2-methylpropyl group, a 1-methylpropyl group or a t-butyl group, or a cyclic alkyl group having 4 to 20 carbon atoms, and the like.

Specific examples of the monomer that can give the structure unit represented by the above formula (3) include (meth)acrylic acid 2-methyladamantan-2-yl ester, (meth)acrylic acid 2-methyl-3-hydroxyadamantan-2-yl ester, (meth)acrylic acid 2-ethyladamantan-2-yl ester, (meth)acrylic acid 2-ethyl-3-hydroxyadamantan-2-yl ester, (meth)acrylic acid 2-n-propyladamantan-2-yl ester, (meth)acrylic acid 2-isopropyladamantan-2-yl ester, (meth)acrylic acid-2-methylbicyclo[2.2.1]hept-2-yl ester, (meth)acrylic acid-2-ethylbicyclo[2.2.1]hept-2-yl ester, (meth)acrylic acid-8-methyltricyclo[5.2.1.0$^{2,6}$]decan-8-yl ester, (meth)acrylic acid-8-ethyltricyclo[5.2.1.0$^{2,6}$]decan-8-yl ester, (meth)acrylic acid-4-methyltetracyclo[6.2.1.1$^{3,6}$.0$^{2,7}$]dodecan-4-yl ester, (meth)acrylic acid-4-ethyltetracyclo[6.2.1.1$^{3,6}$.0$^{2,7}$]dodecan-4-yl ester, (meth)acrylic acid 2-(bicyclo[2.2.1]hept-2-yl)-2-methylethyl ester, (meth)acrylic acid 2-(tricyclo[5.2.1.0$^{2,6}$]decan-8-yl)-2-methylethyl ester, (meth)acrylic acid 2-(tetracyclo[6.2.1.1$^{3,6}$.0$^{2,7}$]dodecan-4-yl)-2-methylethyl ester, (meth)acrylic acid 2-(adamantan-2-yl)-2-methylethyl ester, (meth)acrylic acid 2-(3-hydroxyadamantan-2-yl)-2-methylethyl ester, (meth)acrylic acid 1,2-di(bicyclo[2.2.1]hept-2-yl)ethyl ester, (meth)acrylic acid 1,2-di(tricyclo[5.2.1.0$^{2,6}$]decan-8-yl)ethyl ester, (meth)acrylic acid 1,2-di(tetracyclo[6.2.1.1$^{3,6}$.0$^{2,7}$]dodecan-4-yl)ethyl ester, (meth)acrylic acid 1,2-di(adamantan-2-yl)ethyl ester, (meth)acrylic acid 1-methyl-1-cyclopentyl ester, (meth)acrylic acid 1-ethyl-1-cyclopentyl ester, (meth)acrylic acid 1-methyl-1-cyclohexyl ester, (meth)acrylic acid 1-ethyl-1-cyclohexyl ester, and the like.

<Structure Unit (IV)>

The structure unit (IV) is a structure unit having an alkali-soluble group (except for those corresponding to the above structure unit (II-3)). Due to having the structure unit (IV), the polymer (A) has improved solubility in the developing solution after exposure. As a result, MEEF performance of the radiation-sensitive resin composition, and inhibitory ability of defects such as bridge are improved.

The alkali-soluble group in the structure unit (IV) is preferably a functional group having a hydrogen atom and a pKa of 4 to 11, in light of improvement of the solubility in the developing solution. Specific examples of such a functional group include functional groups represented by the above formulae (4-1) and (4-2), and the like.

In the above formula (4-1), $R^{41}$ represents a hydrocarbon group having 1 to 10 carbon atoms substituted with a fluorine atom.

Although the hydrocarbon group having 1 to 10 carbon atoms substituted with a fluorine atom represented by $R^{41}$ is not particularly limited as long as one, or two or more hydrogen atoms in a hydrocarbon group having 1 to 10 carbon atoms are substituted with a fluorine atom, and a trifluoromethyl group is preferred.

The main chain skeleton of the structure unit (IV) is not particularly limited; however, a skeleton derived from a methacrylic acid ester, an acrylic acid ester, an α-trifluoroacrylic acid ester or the like is preferred.

Examples of the structure unit (IV) include structure units derived from the monomers each represented by the following formula (m-4-1) and the following formula (m-4-2).

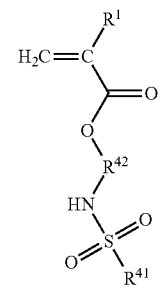

(m-4-1)

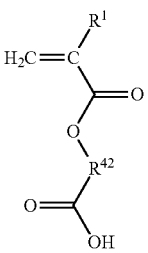

(m-4-2)

In the above formulae (m-4-1) and (m-4-2), $R^1$ represents a hydrogen atom, a lower alkyl group or a halogenated lower alkyl group; and $R^{42}$ represents a bivalent linking group.

In the above formula (m-4-1), $R^{41}$ is as defined in connection with the formula (4-1).

Details of the bivalent linking group represented by $R^{42}$ in the above formulae (m-4-1) and (m-4-2) are as defined in connection with $R^9$ in the above formula (2-3).

The polymer (A) may have the structure unit (IV) of either one type alone or at least two types thereof in combination.

<Structure Unit (V)>

The structure unit (V) is a structure unit having an alkali-reactive group (except for those corresponding to the structure unit (II-3)). When the polymer (A) has the structure unit (V), solubility in the developing solution of the resist film formed from the radiation-sensitive resin composition can be improved. The alkali-reactive group in the structure unit (V) is preferably a group having a lactone structure or a cyclic carbonate structure.

Although a main chain skeleton of the structure unit (V) is not particularly limited, it is preferably a skeleton derived from a methacrylic acid ester, an acrylic acid ester, or an α-trifluoroacrylic acid ester, or the like.

[Structure Unit (V-1) Having Lactone Structure]

The structure unit (V-1) is involved in the structure unit (V) described above and the alkali-reactive group thereof has a lactone structure. Examples of the structure unit (V-1) may include structure units represented by the following formulae (5a-1) to (5a-6).

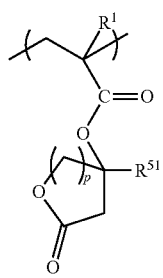

(5a-1)

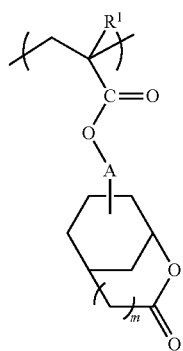

(5a-2)

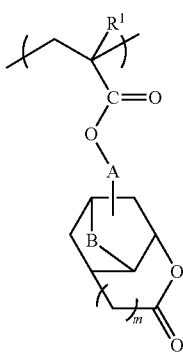

(5a-3)

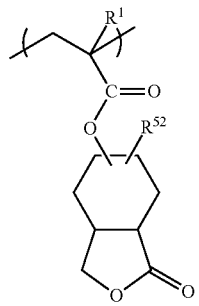

(5a-4)

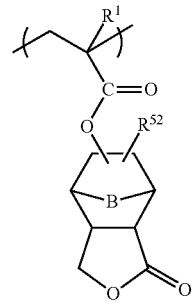

(5a-5)

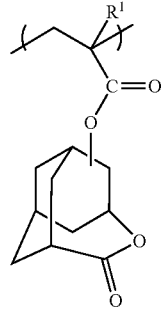

(5a-6)

In the above formula (5a-1) to (5a-6), $R^1$ represents a hydrogen atom, a lower alkyl group or a halogenated lower alkyl group; $R^{51}$ represents a hydrogen atom or an alkyl group having 1 to 4 carbon atoms which may have a substituent; $R^{52}$ represents a hydrogen atom or a methoxy group; A represents a single bond, an ether group, an ester group, a carbonyl group, a bivalent chain hydrocarbon group having 1 to 30 carbon atoms, a bivalent alicyclic hydrocarbon group having 3 to 30 carbon atoms, a bivalent aromatic hydrocarbon group having 6 to 30 carbon atoms, or a bivalent group given by combining the same; B represents an oxygen atom or a methylene group; p is an integer of 1 to 3; and m is 0 or 1.

Examples of the alkyl group having 1 to 4 carbon atoms represented by $R^{51}$ include a methyl group, an ethyl group, a n-propyl group, an i-propyl group, a n-butyl group, a 2-methylpropyl group, a 1-methylpropyl group, a t-butyl group, and the like. In addition, substituent that substitutes a part or all of hydrogen atoms of the alkyl group is specifically exemplified by halogen atoms such as a fluorine atom, a chlorine atom and a bromine atom, a phenyl group, an acyloxy group, an alkoxy group, and the like.

The bivalent chain hydrocarbon group having 1 to 30 carbon atoms represented by A is exemplified by linear alkylene groups such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosalene group; branched alkylene groups such as a 1-methyl-1,3-propylene group, a 2-methyl-1,3-propylene group, a 2-methyl-1,2-propylene group, a 1-methyl-1,4-butylene group, a 2-methyl-1,4-butylene group, methylidene group, an ethylidene group, a 1-propylidene group, and a 2-propylidene group, and the like.

The bivalent alicyclic hydrocarbon group having 3 to 30 carbon atoms represented by A is exemplified by monocyclic cycloalkylene groups such as a 1,3-cyclobutylene group, a 1,3-cyclopentylene group, a 1,4-cyclohexylene group, and a 1,5-cyclooctylene group; polycyclic cycloalkylene groups such as a 1,4-norbornylene group, a 2,5-norbornylene group, a 1,5-adamantylene group, and a 2,6-adamantylene group, and the like.

The bivalent aromatic hydrocarbon group having 6 to 30 carbon atoms represented by A is exemplified by arylene groups such as a phenylene group, a tolylene group, a naphthylene group, a phenanthrylene group and an anthrylene group, and the like.

Also, these chain hydrocarbon groups, alicyclic hydrocarbon groups and aromatic hydrocarbon groups may further have a substituent. Examples of such a substituent include examples of the substituent which may be included in $R^4$ and $R^6$ of the above formulae (1-1) and (1-2).

Specific examples of preferable monomer that gives the structure unit (V-1) having the lactone structure include (meth)acrylic acid-5-oxo-4-oxa-tricyclo[4.2.1.0$^{3,7}$]nona-2-yl ester, (meth)acrylic acid-9-methoxycarbonyl-5-oxo-4-oxa-tricyclo[4.2.1.0$^{3,7}$]nona-2-yl ester, (meth)acrylic acid-5-oxo-4-oxa-tricyclo[5.2.1.0$^{3,8}$]deca-2-yl ester, (meth)acrylic acid-10-methoxycarbonyl-5-oxo-4-oxa-tricyclo[5.2.1.0$^{3,8}$]nona-2-yl ester, (meth)acrylic acid-6-oxo-7-oxa-bicyclo[3.2.1]octa-2-yl ester, (meth)acrylic acid-4-methoxycarbonyl-6-oxo-7-oxa-bicyclo[3.2.1]octa-2-yl ester, (meth)acrylic acid-7-oxo-8-oxa-bicyclo[3.3.1]octa-2-yl ester, (meth)acrylic acid-4-methoxycarbonyl-7-oxo-8-oxa-bicyclo[3.3.1]octa-2-yl ester, (meth)acrylic acid-2-oxo-tetrahydropyran-4-yl ester, (meth)acrylic acid-4-methyl-2-oxotetrahydropyran-4-yl ester, (meth)acrylic acid-4-ethyl-2-oxotetrahydropyran-4-yl ester, (meth)acrylic acid-4-propyl-2-oxotetrahydropyran-4-yl ester, (meth)acrylic acid-5-oxotetrahydrofuran-3-yl ester, (meth)acrylic acid-2,2-dimethyl-5-oxotetrahydrofuran-3-yl ester, (meth)acrylic acid-4,4-dimethyl-5-oxotetrahydrofuran-3-yl ester, (meth)acrylic acid-2-oxotetrahydrofuran-3-yl ester, (meth)acrylic acid-4,4-dimethyl-2-oxotetrahydrofuran-3-yl ester, (meth)acrylic acid-5,5-dimethyl-2-oxotetrahydrofuran-3-yl ester, (meth)acrylic acid-2-oxotetrahydrofuran-3-yl ester, (meth)acrylic acid-5-oxotetrahydrofuran-2-ylmethyl ester, (meth)acrylic acid-3,3-dimethyl-5-oxotetrahydrofuran-2-ylmethyl ester, (meth)acrylic acid-4,4-dimethyl-5-oxotetrahydrofuran-2-ylmethyl ester, and the like.

[Structure Unit (V-2) Having Cyclic Carbonate Structure]

The structure unit (V-2) is involved in the structure unit (V) described above and the alkali-reactive group thereof has a cyclic carbonate structure. Examples of the structure unit (V-2) may include structure units represented by the following formula (5b).

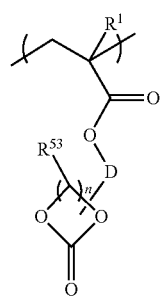

(5b)

In the above formula (5b), $R^1$ represents a hydrogen atom, a lower alkyl group or a halogenated lower alkyl group; $R^{53}$ represents a hydrogen atom or a chain hydrocarbon group having 1 to 5 carbon atoms; n is an integer of 2 to 4; $R^{51}$ may be each the same or different when present in a plurality of number; D represents a single bond, a bivalent or trivalent chain hydrocarbon group having 1 to 30 carbon atoms, a bivalent or trivalent alicyclic hydrocarbon group having 3 to 30 carbon atoms which may include a hetero atom, or a bivalent or trivalent aromatic hydrocarbon group having 6 to 30 carbon atoms, wherein when D represents a trivalent hydrocarbon group, a carbon atom included in D and a carbon atom constituting a cyclic carbonate ring binds to form a ring structure.

In the above formula (5b), n is an integer of 2 to 4. Therefore, the cyclic carbonate structure is a five membered ring structure when n is 2 (ethylene group), a six membered ring structure when n is 3 (propylene group), and a seven membered ring structure when n is 4 (butylene group).

In the above formula (5b), D represents a single bond, a bivalent or trivalent chain hydrocarbon group having 1 to 30 carbon atoms, a bivalent or trivalent alicyclic hydrocarbon group having 3 to 30 carbon atoms which may include a hetero atom, or a bivalent or trivalent aromatic hydrocarbon group having 6 to 30 carbon atoms. A part or all of hydrogen atoms of these chain hydrocarbon group, alicyclic hydrocarbon group and aromatic hydrocarbon group may be substituted.

When D is a single bond, an oxygen atom of the (meth) acrylic ester constituting the polymer (A) is directly bound to the carbon atom that forms the cyclic carbonate structure.

Examples of particularly preferably structure unit represented by the above formula (5b) include structure units represented by the following formulae (5b-1) to (5b-21).

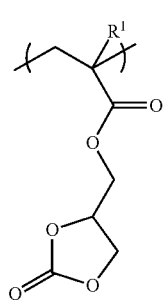

(5b-1)

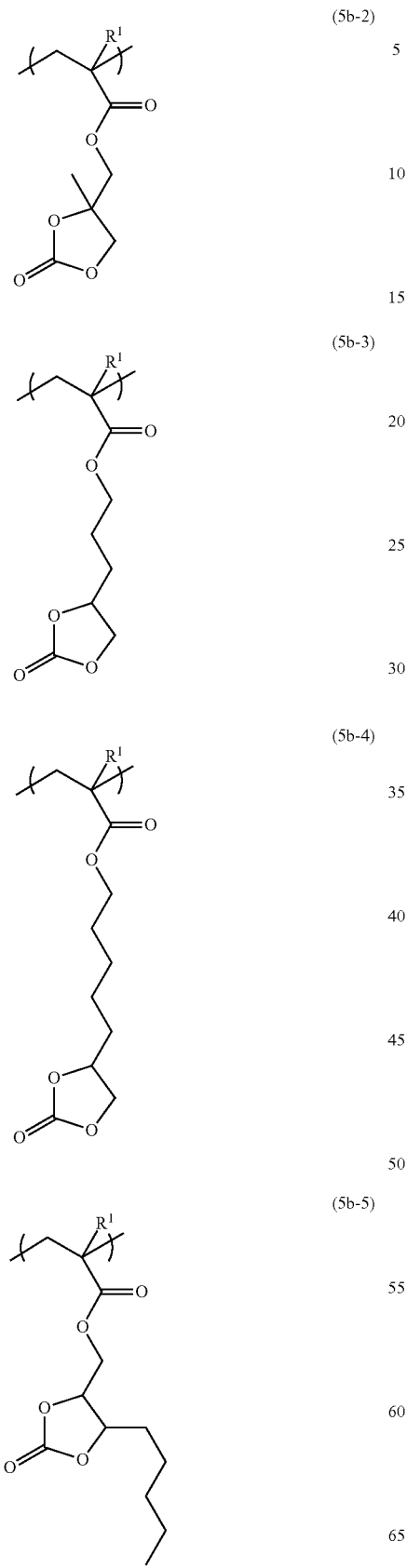
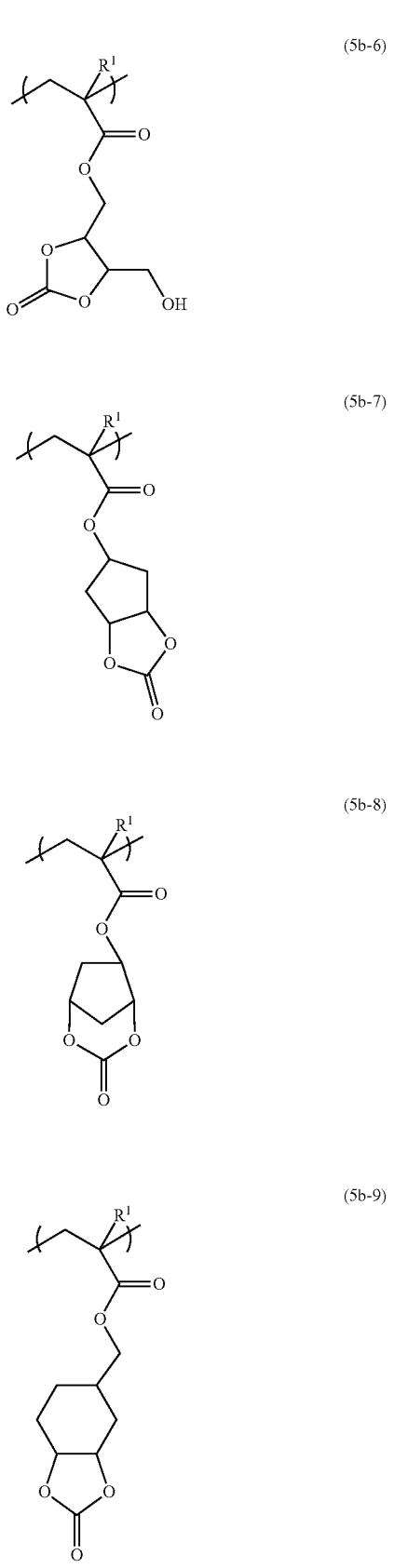

(5b-10)
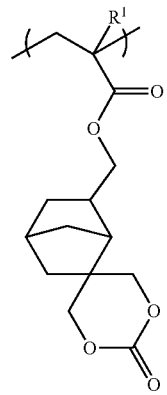
(5b-11)
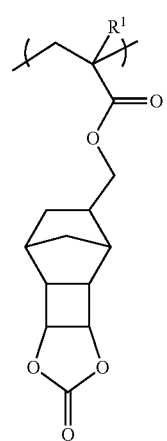
(5b-12)
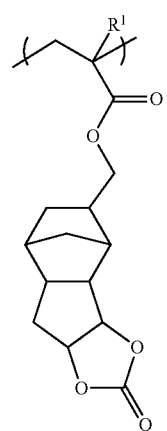
(5b-13)
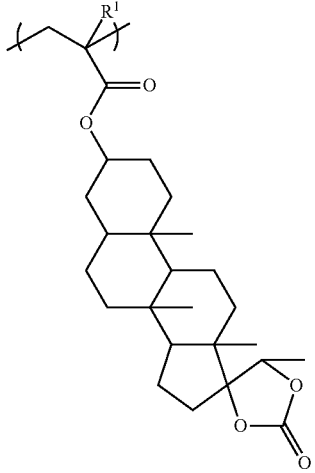
(5b-14)
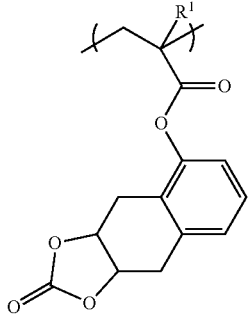
(5b-15)
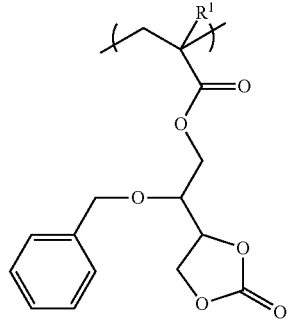
(5b-16)
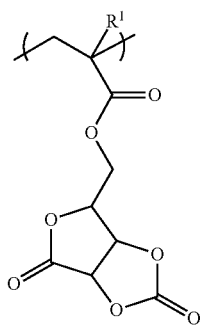

(5b-17) 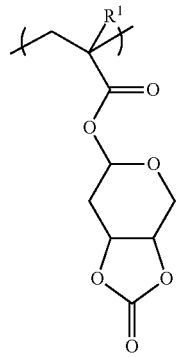

(5b-18) 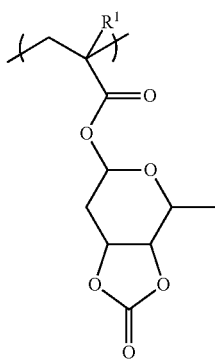

(5b-19) 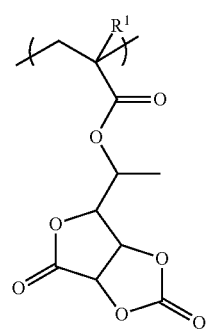

(5b-20) 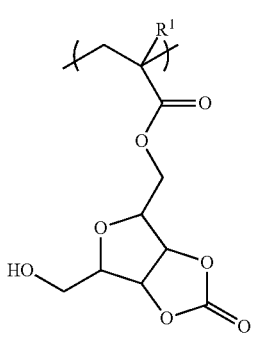

(5b-21) 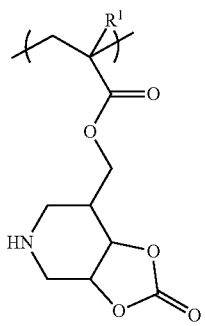

In the above formula (5b-1) to (5b-21), $R^1$ is as defined in connection with the above formula (5b).

It is particularly preferred that the polymer (A) includes as the structure unit (V), at least one type of the structure unit selected from the set consisting of the structure units each represented by the above formulae (5a-1) to (5a-6) and the structure unit represented by the above formula (5b-1), in light of improvement of solubility in the developing solution.

The polymer (A) may include either only one type or at least two types of the structure unit (V).

<Proportion of Each Structure Unit Included>

Preferable proportion of each of the structure units included with respect to the entire structure units constituting the polymer (A) in the embodiment of the present invention is shown hereinbelow.

The proportion of the structure unit (I) included is preferably 10 to 90 mol %, more preferably 20 to 80 mol %, and still more preferably 30 to 80 mol % in light of further improvement of the MEEF performance of the radiation-sensitive resin composition and the inhibitory ability of defects such as bridge.

The proportion of the structure unit (II) included is preferably 20 to 90 mol %, more preferably 20 to 80 mol %, and still more preferably 20 to 70 mol % in light of still further efficient improvement of inhibitory ability of elution of acid generator and the like from the resist film into a liquid for liquid immersion lithography, and receding contact angle between the resist film and the liquid for liquid immersion lithography.

The proportion of the structure unit (III) included is usually no greater than 80 mol %, preferably 20 to 80 mol %, and more preferably 30 to 70 mol % in light of further improvement of pattern formability.

The proportion of the structure unit (IV) included is usually no greater than 50 mol %, preferably 5 to 30 mol %, and more preferably 5 to 20 mol % in light of still further improvement of the MEEF performance of the radiation-sensitive resin composition and the inhibitory ability of defects such as bridge.

The proportion of the structure unit (V) included is usually no greater than 50 mol %, preferably 5 to 30 mol %, and more preferably 5 to 20 mol %, in light of improvement of the affinity of the resist film formed from the radiation-sensitive resin composition to the developing solution.

[Content of Fluorine Atom]

The content of fluorine atoms in the polymer (A) is no less than 5% by mass, preferably 5 to 50% by mass, and more preferably 5 to 40% by mass with respect to 100% by mass of the entire polymer (A). It should be noted that the content of fluorine atoms can be determined by $^{13}C$-NMR. When the content of fluorine atoms in the polymer (A) falls within the above range, water repellency of the surface of a resist coated film formed from the radiation-sensitive resin composition containing the polymer (A), and the polymer (B) described later can be improved, whereby necessity of additional formation of an upper layer film in liquid immersion lithography.

The content of the polymer (A) in the radiation-sensitive resin composition is preferably from 0.1 parts by mass to 20 parts by mass, and more preferably from 0.5 parts by mass to 15 parts by mass with respect to 100 parts by mass of the polymer (B) described later. When the content falls within the above range, further inhibition of bridge defects is enabled, and a pattern that is further superior in the MEEF performance can be formed. In addition, a resist film from which the acid generator or the like is further less likely to be eluted can be obtained. When the content of the polymer (A) is lower than the above lower limit, the aforementioned effect tends to be inferior. On the other hand, when the content of the polymer (A) is higher than the above upper limit, the focal depth of a dependent line (line portion) may be small, and/or development defects may occur when a line and space pattern is formed.

Either one type alone or at least two types of the polymer (A) may be included in the radiation-sensitive resin composition of the embodiment of the present invention.

<Synthesis Method of Polymer (A)>

The polymer (A) can be synthesized by polymerizing, for example, a polymerizable unsaturated monomer that gives each specified structure unit using a radical polymerization initiator such as hydroperoxides, dialkyl peroxides, diacyl peroxides, or azo compound, in the presence of a chain transfer agent as needed in an appropriate solvent.

The solvent which may be used in the polymerization is exemplified by, alkanes such as n-pentane, n-hexane, n-heptane, n-octane, n-nonane and n-decane; cycloalkanes such as cyclohexane, cycloheptane, cyclooctane, decalin and norbornane; aromatic hydrocarbons such as benzene, toluene, xylene, ethylbenzene and cumene; halogenated hydrocarbons such as chlorobutanes, bromohexanes, dichloroethanes, hexamethylene dibromide and chlorobenzene; saturated carboxylate esters such as ethyl acetate, n-butyl acetate, i-butyl acetate and methyl propionate; ketones such as acetone, 2-butanone, 4-methyl-2-pentanone and 2-heptanone; ethers such as tetrahydrofuran, dimethoxyethanes and diethoxyethanes; alcohols such as methanol, ethanol, 1-propanol, 2-propanol and 4-methyl-2-pentanol, and the like. These solvents may be used either of one type alone, or at least two types thereof may be used in combination.

The reaction temperature in the polymerization is preferably 40 to 150° C., and more preferably 50 to 120° C. Furthermore, the reaction time is preferably 1 to 48 hours, and more preferably 1 to 24 hours.

The polystyrene equivalent weight average molecular weight (hereinafter, may be also referred to as "Mw") of the polymer (A) as determined by gel permeation chromatography (GPC) is preferably 1,000 to 50,000, more preferably 1,000 to 40,000, and still more preferably 1,000 to 30,000. When the Mw falls within this range, a resist film having a sufficient receding contact angle can be obtained while maintaining favorable developability.

The ratio (Mw/Mn) of the Mw to the polystyrene equivalent number average molecular weight (hereinafter, may be also referred to as "Mn") as determined by GPC of the polymer (A) is preferably 1 to 5, and more preferably 1 to 4.

It is preferred that the polymer (A) has a content of impurities such as halogen and metal as low as possible. When the content of impurities is low, sensitivity, resolution, process stability, pattern configuration and the like of the resist film can be further improved.

The method for purifying the polymer (A) may include, for example, washing with water, a chemical purification method such as liquid-liquid extraction, a combined method of such a chemical purification method with a physical purification such as ultrafiltration and centrifugal separation, and the like.

Examples of the solvent for use in the liquid-liquid extraction include, alkanes such as n-pentane, n-hexane, n-heptane, n-octane, n-nonane and n-decane; alcohols such as methanol, ethanol, 1-propanol, 2-propanol and 4-methyl-2-pentanol; ketones such as acetone, 2-butanone, 4-methyl-2-pentanone and 2-heptanone, and the like. Among these, n-hexane, n-heptane, methanol, ethanol, acetone, and 2-butanone are preferred.

<(B) Polymer>

The polymer (B) has an acid-dissociable group, and has a content of fluorine atoms of less than 5% by mass. the polymer (B) becomes alkali-soluble upon dissociation of this acid-dissociable group. Although the acid-dissociable group of the polymer (B) is not particularly limited, a group having a cyclic hydrocarbon group in its structure is preferred. The polymer (B) including an acid-dissociable group having a cyclic hydrocarbon group is advantageous in terms of leading to high sensitivity due to easy dissociation of the acid-dissociable group.

Examples of the acid-dissociable group having a cyclic hydrocarbon include, a 1-(1-methyl)cyclopentyl group, a 1-(1-ethyl)cyclopentyl group, a 1-(1-n-propyl)cyclopentyl group, a 1-(1-isopropyl)cyclopentyl group, a 1-(1-methyl)cyclohexyl group, a 1-(1-ethyl)cyclohexyl group, a 1-(1-methyl)cyclooctyl group, a 1-(1-ethyl)cyclooctyl group, a 1-(1-methyl)adamantyl group, a 1-(1-ethyl)adamantyl group, a 1-(1-n-propyl)adamantyl group, and a 1-(1-isopropyl)adamantyl group. Also, groups obtained by substituting a part or all of hydrogen atoms of these groups with at least one or at least one types of, for example, a linear or branched alkyl group having 1 to 4 carbon atoms such as a methyl group, an ethyl group, a n-propyl group, an i-propyl group, a n-butyl group, a 2-methylpropyl group, a 2-methylpropyl group or a t-butyl group, or a cyclic alkyl group having 4 to 20 carbon atoms, and the like may be exemplified. Among these, in light of ease in dissociation of the acid-dissociable group, a 1-(1-ethyl)cyclopentyl group is preferred.

Specific examples of the polymer (B) include: polymers having an alicyclic skeleton in the main chain such as a norbornane ring obtained by polymerizing a norbornene derivative; polymers having a norbornane ring and a maleic anhydride-derived skeleton in the main chain obtained by copolymerizing a norbornene derivative and maleic anhydride; polymers having a norbornane ring and a (meth)acryl structure in the main chain obtained by copolymerizing a norbornene derivative and a (meth)acrylic compound; polymers having a norbornane ring, a maleic anhydride-derived skeleton and a (meth)acryl structure in the main chain obtained by copolymerizing a norbornene derivative, maleic anhydride and a (meth) acrylic compound; polymers having a (meth)acryl structure in the main chain obtained by polymerizing a (meth)acrylic compound, and the like.

It is preferred that the polymer (B) includes the structure unit (I) and/or the structure unit (III) described above (hereinafter, may be also referred to as "structure unit (b1)" in the entirety).

The proportion of the structure unit (b1) included in the polymer (B) is preferably 10 to 70 mol %, more preferably 15 to 60 mol %, and still more preferably 20 to 50 mol % with respect to the entire structure units constituting the polymer (B). When this proportion is below the aforementioned lower limit, resolution of the resist film formed may be deteriorated. On the other hand, when the proportion is greater than the aforementioned upper limit, developability, and exposure latitude may be inferior.

It is preferred that the polymer (B) further includes structure unit having a lactone structure (hereinafter, may be also referred to as "lactone structure-containing structure unit") and/or a structure unit having a cyclic carbonate structure (hereinafter, may be also referred to as "cyclic carbonate structure-containing structure unit"). By including the lactone structure-containing structure unit and/or the cyclic carbonate structure-containing structure unit, adhesiveness of the resist film to a substrate can be improved.

The proportion of the lactone structure-containing structure unit and cyclic carbonate structure-containing structure unit included in the polymer (B) is preferably 5 to mol %, more preferably 10 to 70 mol %, and still more preferably 15 to 60 mol % with respect to entire structure units each independently constituting the polymer (B).

[Content of Fluorine Atoms]

The content of fluorine atoms in the polymer (B) is less than 5% by mass, preferably 0 to 4.9% by mass, and more preferably 0 to 4% by mass. It is to be noted that the content of fluorine atoms can be determined by $^{13}$C-NMR. The content of fluorine atoms in the polymer (B) falling within the above range can serve in elevating water repellency of the surface of the resist coated film formed from the radiation-sensitive resin composition containing the polymer (B) and the polymer (A) described above, and thus the need for separately forming an upper layer film in liquid immersion lithography can be eliminated.

<Synthesis Method of Polymer (B)>

The polymer (B) can be synthesized by polymerizing, for example, a polymerizable unsaturated monomer that gives each specified structure unit using a radical polymerization initiator such as hydroperoxides, dialkyl peroxides, diacyl peroxides, or azo compound, in the presence of a chain transfer agent as needed in an appropriate solvent.

The solvent which may be used in the polymerization of the polymer (B) is exemplified by, alkanes such as n-pentane, n-hexane, n-heptane, n-octane, n-nonane and n-decane; cycloalkanes such as cyclohexane, cycloheptane, cyclooctane, decalin and norbornane; aromatic hydrocarbons such as benzene, toluene, xylene, ethylbenzene and cumene; halogenated hydrocarbons such as chlorobutanes, bromohexanes, dichloroethanes, hexamethylene dibromide and chlorobenzene; saturated carboxylate esters such as ethyl acetate, n-butyl acetate, i-butyl acetate and methyl propionate; ketones such as acetone, 2-butanone, 4-methyl-2-pentanone and 2-heptanone; ethers such as tetrahydrofuran, dimethoxyethanes and diethoxyethanes, and the like. These solvents may be used either of one type alone, or at least two types thereof may be used in combination.

The reaction temperature in the polymerization is preferably 40 to 150° C., and more preferably 50 to 120° C. Furthermore, the reaction time is preferably 1 to 48 hours, and more preferably 1 to 24 hours.

The Mw of the polymer (B) as determined by GPC is preferably 1,000 to 100,000, more preferably 1,000 to 30,000, and still more preferably 1,000 to 20,000. When the Mw is less than the above lower limit, heat resistance of the resist film formed may be deteriorated. On the other hand, when the Mw is beyond the above upper limit, developability of the resist film formed may be deteriorated.

The ratio (Mw/Mn) of Mw to Mn of the polymer (B) is preferably 1 to 5, and more preferably 1 to 3.

In the polymer (B), the proportion of low molecular weight components derived from the monomer used in preparation of the polymer (B) (hereinafter, may be also referred to as "low molecular weight component (b)") contained in the polymer (B) is preferably no greater than 0.1% by mass, more preferably no greater than 0.07% by mass, and still more preferably no greater than 0.05% by mass. When this proportion is no greater than 0.1% by mass, decrease in the amount of matter eluted into the liquid for liquid immersion lithography such as water that comes in contact with the resist film in liquid immersion lithography is enabled. Moreover, unwanted substance is less likely to be generated during storage of the radiation-sensitive resin composition, and nonuniform coating is less likely to be provided in application. In addition, occurrence of defects during formation of the resist pattern can be more favorably inhibited.

The low molecular weight component (b) is a component having a molecular weight of no greater than 500 and may include, for example, a monomer, and a dimer, trimer and oligomer derived from the monomer. It should be noted that the low molecular weight component (b) can be eliminated by, for example, washing with water, a chemical purification method such as liquid-liquid extraction, a combined method of such a chemical purification method with a physical purification such as ultrafiltration and centrifugal separation, or the like.

It is to be noted that the polymer (B) preferably has a content of impurities such as halogen and metal as low as possible. When the content of impurities is low, sensitivity, resolution, process stability, pattern configuration and the like of the resist film can be further improved.

The method for purifying the polymer (B) may include, as described above, washing with water, a chemical purification method such as liquid-liquid extraction, a combined method of such a chemical purification method with a physical purification such as ultrafiltration and centrifugal separation, and the liked.

Either one type alone or at least two types of the polymer (B) may be included in the radiation-sensitive resin composition of the embodiment of the present invention.

<(C) Acid Generator>

The acid generator (C) generates an acid upon exposure. The acid generator (C) allows the acid-dissociable group present in the polymer (A) to be dissociated by an action of an acid generated by exposure, thereby making the polymer (A) alkali soluble. As a result, site exposed with lights of the resist film become easily soluble in an alkaline developer, and thus formation of a positive type resist pattern is enabled. Such an acid generator (C) is exemplified by compounds disclosed in paragraph Nos. [0080] to [0113] of Japanese Unexamined Patent Application, Publication No. 2009-134088, and the like.

Specific examples of preferable acid generator (C) include diphenyl iodonium trifluoromethanesulfonate, diphenyl iodonium nonafluoro-n-butanesulfonate, diphenyl iodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate, triphenylsulfonium perfluoro-n-octanesulfonate, cyclohexyl-2-oxocyclohexylmethylsulfonium trifluoromethanesulfonate, dicyclohexyl-2-oxocyclohexylsulfonium trifluoromethanesulfonate, 2-oxocyclohexyldimethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-hydroxy-1-naphthyltetrahydrothiophenium nonafluoro-n-butanesulfonate, 4-hydroxy-1-naphthyltetrahydrothiophenium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimide trifluoromethanesulfonate, N-hydroxysuccinimide nonafluoro-n-butanesulfonate, N-hydroxysuccinimide perfluoro-n-octanesulfonate, 1,8-naphthalenedicarboxylic acid imide trifluoromethanesulfonate. The acid generator (C) may be contained of either one type alone or at least two types thereof in combination.

The content of the acid generator (C) is preferably 0.1 to 30 parts by mass, more preferably 2 to 27 parts by mass, and particularly preferably 5 to 25 parts by mass with respect to 100 parts by mass of the polymer (A). When the content of the acid generator (C) is less than 0.1 parts by mass, sensitivity and/or resolution as a resist film may be deteriorated. On the other hand, when the content of the acid generator (C) is beyond 30 parts by mass, coating property and/or pattern configuration as a resist film may be deteriorated.

<Optional Component>

The radiation-sensitive resin composition of the embodiment of the present invention may contain, as needed, optional components such as an acid diffusion control agent, a solvent, and various types of additives (for example, an alicyclic additive, a surfactant, a lactone compound, etc.), in addition to the polymer (A), the polymer (B) and the acid generator (C).

[Acid Diffusion Control Agent]

Examples of the acid diffusion control agent include compounds represented by the following formula (6) (hereinafter, may be also referred to as "nitrogen-containing compound (I)"), compounds having two nitrogen atoms in one molecule (hereinafter, may be also referred to as "nitrogen-containing compound (II)"), compounds having at least three nitrogen atoms (hereinafter, may be also referred to as "nitrogen-containing compound (III)"), amide group-containing compounds, urea compounds, nitrogen-containing heterocyclic compounds, and the like. When the radiation-sensitive resin composition contains the acid diffusion control agent, excellence of pattern configuration and/or dimension fidelity as a resist can be improved.

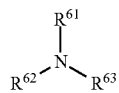

(6)

In the above formula (6), $R^{61}$ to $R^{63}$ each independently represent a hydrogen atom, or a linear, branched or cyclic alkyl group, aryl group, or aralkyl group which may be substituted.

Examples of the nitrogen-containing compound (I) include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine and tri-n-decylamine; aromatic amines such as aniline, N-methylaniline, N,N-dimethylaniline, 2-methylaniline, 3-methylaniline, 4-methylaniline, 4-nitroaniline, diphenylamine, triphenylamine, 1-naphthylamine, 2-(4-aminophenyl)-2-(3-hydroxyphenyl)propane and 2-(4-aminophenyl)-2-(4-hydroxyphenyl)propane, and the like.

Examples of the nitrogen-containing compound (II) include ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, and the like.

Examples of the nitrogen-containing compound (III) include polymers such as polyethyleneimine, polyallylamine and dimethylaminoethylacrylamide.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include in addition to pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, quinoline, 8-oxyquinoline and acridine, as well as pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2]octane, and the like.

Among these acid diffusion control agents, the nitrogen-containing compound (I), the nitrogen-containing compound (II), and the nitrogen-containing heterocyclic compound are preferred. The acid diffusion control agent may be used of either one type alone or at least two types thereof in combination. The content of the acid diffusion control agent is preferably no greater than 10 parts by mass, and more preferably no greater than 5 parts by mass with respect to 100 parts by mass of the polymer (B). When the content of the acid diffusion control agent is beyond the above upper limit, sensitivity of the resist film formed tends to be significantly lowered.

[Alicyclic Additive]

The alicyclic additive is a component having an effect of additionally improving dry etching resistance, pattern configuration, adhesiveness to the substrate, and the like. Examples of such an alicyclic additive include adamantane derivatives such as t-butyl 1-adamantane carboxylate, t-butoxycarbonylmethyl 1-adamantanecarboxylate, di-t-butyl 1,3-adamantanedicarboxylate, t-butyl 1-adamantylacetate, t-butoxycarbonylmethyl 1-adamantylacetate, and di-t-butyl 1,3-adamantylenediacetate; deoxycholic acid esters such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate and deoxycholic acid mevalonolactone ester; lithocholic acid esters such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate and lithocholic acid mevalonolactone ester, and the like. These alicyclic additives may be used either of one type alone, or as a mixture of at least two types thereof. The content of the alicyclic additive is usually no greater than 50 parts by mass, and preferably no greater than 30 parts by mass with respect to 100 parts by mass of the polymer (B).

[Surfactant]

The surfactant is a component that has an effect of improving coating properties, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, as well as trade names KP341 (all manufactured by Shin-Etsu Chemical Co., Ltd.), Polyflow No. 75 and Polyflow No. 95 (all manufactured by Kyoeisha Chemical Co., Ltd.), EFTOP EF301, EFTOP EF303 and EFTOP EF352 (all manufactured by Tochem Products Corporation), Megaface® F171 and Megaface® F173 (all manufactured by Dainippon Ink And Chemicals, Incorporated), Fluorad™ FC430 and Fluorad FC431 (all manufactured by Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (all manufactured by Asahi Glass Co., Ltd.), and the like. These surfactants may be used either of one type alone, or as a mixture of at least two types thereof. The content of the surfactant is usually no greater than 2 parts by mass with respect to 100 parts by mass of the polymer (B).

[Lactone Compound]

The lactone compound has an effect of efficiently segregating the polymer (A) on the surface of the resist film. Therefore, by including the lactone compound, the amount of the polymer (A) to be added can be reduced as compared with conventionally employed amount. Therefore, elution of the components from the resist film into the liquid immersion liquid can be inhibited without deteriorating basic characteristics of resist such as LWR (Line Width Roughness) excellence, inhibitory ability of development defects and pattern collapse resistance, and remaining of droplets can be prevented even if liquid immersion lithography is carried out by fast scanning. As a result, defects resulting from liquid immersion such as water mark and the like can be inhibited while water repellency of the surface of the resist film is maintained.

Specific examples of the lactone compound include γ-butyrolactone, valerolactone, mevalonic lactone, norbornane lactone, and the like.

In the radiation-sensitive resin composition, one type of the lactone compound alone may be contained, or two types or more may be contained.

In the radiation-sensitive resin composition, the content of the lactone compound is preferably 30 to 200 parts by mass, and more preferably 50 to 150 parts by mass with respect to 100 parts by mass of the polymer (B).

<Preparation of Radiation-Sensitive Resin Composition>

The radiation-sensitive resin composition may be prepared by, for example, mixing the polymer (A), the polymer (B) and the acid generator (C), and if necessary optional components at certain proportions. The radiation-sensitive resin composition is usually prepared in the form of a composition solution upon use by dissolving in a solvent to give the entire solid content concentration of 1 to 50% by mass, and preferably 3 to 25% by mass, and thereafter filtering through a filter having a pore size of, for example, about 0.02 μm.

Examples of the solvent which may be used for preparing the composition solution include linear or branched ketones; cyclic ketones; propylene glycol monoalkyl ether acetates; 2-hydroxypropionic acid alkyls; 3-alkoxypropionic acid alkyls, as well as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethoxyethyl acetate, hydroxyethyl acetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, acetoethyl acetate, methyl pyruvate, ethyl pyruvate, N-methylpyrrolidone, N,N-dimethylformamide, N,N-dimethylacetamide, benzylethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, ethylene carbonate, propylene carbonate, and the like.

These solvents may be used either of one type alone, or as a mixture of at least two thereof. Among these, linear or branched ketones, cyclic ketones, propylene glycol monoalkyl ether acetates, 2-hydroxypropionic acid alkyls, and 3-alkoxypropionic acid alkyls are preferred.

<Method for Forming Resist Pattern>

The method for forming a resist pattern of the embodiment of the present invention includes: (1) a step of forming a photoresist film on a substrate using the radiation-sensitive resin composition (hereinafter, may be also referred to as "step (1)"), (2) a step of subjecting the photoresist film to liquid immersion lithography through a liquid for immersion lithography provided on the photoresist film (hereinafter, may be also referred to as "step (2)"), and (3) a step of forming a resist pattern by developing the photoresist film subjected to the liquid immersion lithography (hereinafter, may be also referred to as "step (3)"). According to the method for forming a resist pattern, a resist pattern having a favorable pattern configuration can be formed.

In the step (1), the radiation-sensitive resin composition of the embodiment of the present invention is applied on a substrate such as e.g., silicon wafer or wafer coated with aluminum, by an appropriate means for application such as spin-coating, cast coating or roll coating to form a resist film. Specifically, after the radiation-sensitive resin composition solution is applied such that the resulting resist film has a predetermined film thickness, the solvent in the coating film is evaporated by prebaking (PB) to form a resist film.

Although the thickness of the resist film is not particularly limited, it is preferably 10 to 5,000 nm, and more preferably 10 to 2,000 nm. Conditions of heating in the prebaking may very depending on the blend composition of the radiation-sensitive resin composition, and may involve preferably about 30 to 200° C. and more preferably 50 to 150° C.

In the step (2), a liquid for immersion lithography is provided on the photoresist film formed in the step (1), and a radioactive ray is irradiated through the liquid for immersion lithography to execute liquid immersion lithography of the photoresist film.

As the liquid for immersion lithography, for example, pure water, a long chain or cyclic aliphatic compound or the like may be used.

The radioactive ray employed is appropriately selected from visible light rays, ultraviolet rays, far ultraviolet rays, X-rays, charged particle rays and the like in accordance with the type of the acid generator (C) used. The radioactive ray is preferably a far ultraviolet ray typified by ArF excimer laser light (wavelength: 193 nm) or KrF excimer laser light (wavelength: 248 nm), and particularly preferably ArF excimer laser light (wavelength: 193 nm).

Also, conditions of the exposure such as exposure dose may be appropriately determined in accordance with the blend composition of the radiation-sensitive resin composition and the type of the additives.

In the method for forming a pattern of the embodiment of the present invention, a heat treatment (PEB: post exposure baking) is preferably carried out after the exposure. The PEB enables a dissociation reaction of the acid-dissociable group in the polymer components to smoothly proceed. Conditions of heating of the PEB may be appropriately adjusted depending on the blend composition of the radiation-sensitive resin composition, and involve usually 30 to 200° C., and preferably 50 to 170° C.

In the method for forming a pattern of the embodiment of the present invention, in order to maximize the potential capability of the radiation-sensitive resin composition, an organic or inorganic antireflection film may be also formed on the substrate employed, as disclosed in, for example, Japanese Examined Patent, Publication No. H6-12452 (Japanese Unexamined Patent Application, Publication No. S59-93448), and the like. Moreover, in order to prevent influences of basic impurities etc., included in the environment atmosphere, a protective film may be also provided on the resist film, as disclosed in, for example, Japanese Unexamined Patent Application, Publication No. H5-188598, and the like. Furthermore, in order to prevent effluence of the acid generator etc., from the resist film during the liquid immersion lithography, a protective film for liquid immersion may be provided on the resist film, as disclosed in, for example, Japanese Unexamined Patent Application, Publication No. 2005-352384, and the like. It is to be noted that these techniques may be used in combination.

In the method for forming a resist pattern by the liquid immersion lithography, the resist pattern can be formed with only with the resist film obtained using the radiation-sensitive resin composition of the embodiment of the present invention, without providing the protective film (upper layer film) described above on the resist film. If a resist pattern is formed with the resist film that is free from the upper layer film, a step of forming a protective film (upper layer film) can be omitted, thereby capable of leading to expectation for improvement of throughput.

In the step (3), a predetermined resist pattern is formed by development of the resist film subjected to liquid immersion lithography in the step (2).

The developing solution used in the development is preferably an alkaline aqueous solution prepared by dissolving at least one of alkaline compounds such as, for example, sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene.

The concentration of the alkaline aqueous solution is preferably no greater than 10% by mass. When the concentration of the alkaline aqueous solution is greater than 10% by mass, sites unexposed with light may be also dissolved in the developing solution.

In addition, an organic solvent may be also added to the developing solution consisting of the aforementioned alkaline aqueous solution.

Examples of the organic solvent include ketones such as acetone, 2-butanone, methyl-i-butylketone, cyclopentanone, cyclohexanone, 3-methylcyclopentanone and 2,6-dimethyl-cyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol and 1,4-hexanedimethylol; ethers such as tetrahydrofuran and dioxane; esters such as ethyl acetate, n-butyl acetate and i-amyl acetate; aromatic hydrocarbons such as toluene and xylene, as well as phenol, acetonyl acetone, dimethylformamide, and the like. These organic solvents may be used either of one type alone, or in combination of at least two thereof.

The amount of the organic solvent used is preferably no greater than 100 parts by volume with respect to 100 parts by volume of the alkaline aqueous solution. When the amount of the organic solvent used is greater than 100 parts by volume, developability is lowered, and thus undeveloped portion at the site exposed with light may increase. To the developing solution consisting of the alkaline aqueous solution may be added an appropriate amount of a surfactant and the like. It is to be noted that the development with a developing solution consisting of the alkaline aqueous solution is, in general, followed by washing with water and drying.

<Polymer>

The polymer of the embodiment of the present invention has at least one type of a structure unit (I) selected from the set consisting of a plurality of structure units each represented by the above formulae (1-1) and (1-2), and has a content of fluorine atoms of no less than 5% by mass.

In the above formulae (1-1) and (1-2), $R^1$ each independently represents a hydrogen atom, a lower alkyl group or a halogenated lower alkyl group.

In the above formula (1-1), Y represents a saturated hydrocarbon group having a valency of (2+d); $R^2$ and $R^3$ each independently represent an alkyl group, wherein $R^2$ and $R^3$ may bind with each other to form an alicyclic structure together with Y; $R^4$ represents an alkyl group, an alkoxy group, an acyl group or an acyloxy group; $R^3$ or $R^4$ is present in a plurality of number, the plurality of $R^3$ and $R^4$ may be the same or different with each other; a part or all of hydrogen atoms of $R^4$ may be substituted; a is 1 or 2; b is an integer of 0 to 3; and d is 1 or 2.

In the above formula (1-2), $R^5$ represents an alkyl group; $R^6$ represents an alkyl group, an alkoxy group, an acyl group or an acyloxy group; $R^6$ is present in a plurality of number, the plurality of $R^6$ may be the same or different; a part or all of hydrogen atoms of $R^6$ may be substituted; e is 1 or 2; and f is an integer of 0 to 5.

The polymer can be unevenly distributed in the surface layer of the resist film due to having a content of fluorine atoms of no less than a certain value as described above, and has a feature of becoming easily dissolved in a developing solution after being subjected to the action of an acid. Therefore, the polymer is suited for, for example, radiation-sensitive resin compositions used in lithography techniques, and the like.

Since the polymer is described in connection with the radiation-sensitive resin composition, detailed description of the polymer is omitted in this section.

EXAMPLES

Hereinafter, embodiments of the present invention are more specifically described by way of Examples. However, these Examples should not be construed as in any way limiting the present invention. Herein, the "part" is on mass basis unless otherwise stated particularly. Determination of physical properties in Examples was carried out according to the following procedure.

[Weight Average Molecular Weight (Mw) and Number Average Molecular Weight (Mn)]

Mw and Mn of the polymer (A) and the polymer (B) were measured by gel permeation chromatography (GPC) using GPC columns manufactured by Tosoh Corporation (G2000HXL×2, G3000HXL×1, G4000HXL×1) under analysis conditions including a flow rate of 1.0 mL/min, an elution solvent of tetrahydrofuran, a column temperature of 40° C., with mono-disperse polystyrene as a standard. In addition, dispersity index (Mw/Mn) was calculated from the results of measurement of Mw and Mn.

[$^{13}$C-NMR Analysis]

$^{13}$C-NMR analysis of the polymer (A) and the polymer (B) was carried out using "JNM-EX270" manufactured by JEOL Ltd.

Synthesis of Polymer (A)>

Monomers (compounds (M-1) to (M-9)) used in synthesizing the polymer (A) (polymers (A-1) to (A-11)) are shown below.

It is to be noted that the following compounds (M-1) to (M-4) are monomers that give the above-described structure units (1-1) and (1-2), whereas the following compounds (M-6) and (M-9) are monomers that give the above-described structure units (2-1) to (2-3).

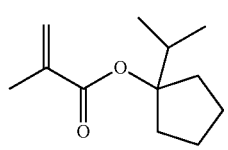
(M-1)

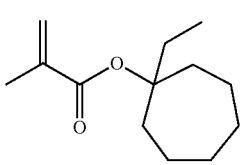
(M-2)

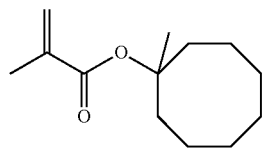
(M-3)

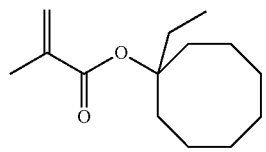
(M-4)

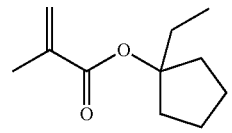
(M-5)

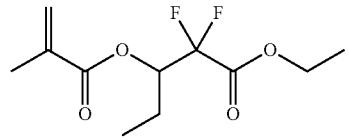
(M-6)

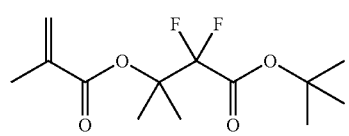
(M-7)

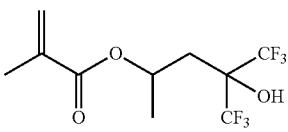
(M-8)

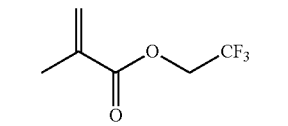
(M-9)

Synthesis Example 1

Synthesis of Polymer (A-1)

First, a monomer solution was provided by dissolving 60 mol % of the compound (M-1), 25 mol % of the compound (M-7) and 15 mol % of the compound (M-8) as monomers, and an initiator (2,2'-azobisisobutyronitrile (AIBN)) in 50 g of 2-butanone. Total amount of the monomers charged was 50 g. Note that the "mol %" of each monomer means "% by mole" with respect to the total amount of the monomers, and the proportion of the initiator used was 5 mol % with respect to the total amount of the monomers and the initiator.

On the other hand, a 500 mL three-neck flask equipped with a thermometer and a dropping funnel was charged with 50 g of 2-butanone, and purged with nitrogen for 30 min. Thereafter, the interior of the flask was heated to 80° C. while stirring with a magnetic stirrer.

Next, the monomer solution was added dropwise into the flask using a dropping funnel over 3 hrs. After the dropwise addition, the mixture was aged for 3 hrs, and then cooled to no higher than 30° C. to give a polymer solution.

Subsequently, the polymer solution was transferred to a 2 L separatory funnel, and thereafter the polymer solution was uniformly diluted with 150 g of n-hexane, followed by charging 600 g of methanol thereto and mixing the solution. Thereto 30 g of distilled water was then charged, followed by stirring the mixture, which was then left to stand for 30 min. Thereafter, the underlayer was recovered to give a propylene glycol monomethyl ether acetate solution. The polymer included in the propylene glycol monomethyl ether acetate solution is designated as polymer (A-1).

The polymer (A-1) had Mw of 6,000, and Mw/Mn of 1.7. As a result of the $^{13}$C-NMR analysis, the polymer (A-1) was a copolymer in which the proportion of included each structure unit derived from each monomer was 58.8, 23.4 and 17.8 (mol %) for (M-1), (M-7) and (M-8).

Synthesis Examples 2 to 11

Synthesis of Polymers (A-2) to (A-11)

Polymers (A-2) to (A-11) were synthesized in a similar manner to Synthesis Example 1 except that monomer compounds of the type and the blend ratio shown in Table 1 below were used. In regard to thus obtained each polymer, the proportion of included structure units derived from each monomer, the weight average molecular weight (Mw) and the dispersity index (Mw/Mn) were determined. Values derived by the measurement are shown in Table 2.

TABLE 1

| Polymer | Monomer species | Blend ratio (mol %) |
|---|---|---|
| A-1 | M-1 | 60 |
|  | M-7 | 25 |
|  | M-8 | 15 |
| A-2 | M-3 | 60 |
|  | M-7 | 25 |
|  | M-8 | 15 |
| A-3 | M-4 | 60 |
|  | M-7 | 25 |
|  | M-8 | 15 |
| A-4 | M-1 | 60 |
|  | M-6 | 40 |
| A-5 | M-2 | 40 |
|  | M-6 | 60 |
| A-6 | M-3 | 40 |
|  | M-6 | 60 |
| A-7 | M-4 | 40 |
|  | M-6 | 60 |
| A-8 | M-1 | 70 |
|  | M-9 | 30 |
| A-9 | M-4 | 50 |
|  | M-9 | 50 |
| A-10 | M-5 | 70 |
|  | M-6 | 30 |
| A-11 | M-5 | 70 |
|  | M-9 | 30 |

TABLE 2

| Polymer | Deriving monomer species | Proportion included | Mw | Mw/Mn |
|---|---|---|---|---|
| A-1 | M-1 | 58.8 | 6,000 | 1.7 |
|  | M-7 | 23.4 |  |  |
|  | M-8 | 17.8 |  |  |
| A-2 | M-3 | 57.4 | 6,100 | 1.6 |
|  | M-7 | 24.5 |  |  |
|  | M-8 | 18.1 |  |  |
| A-3 | M-4 | 57.6 | 6,300 | 1.7 |
|  | M-7 | 23.8 |  |  |
|  | M-8 | 18.6 |  |  |
| A-4 | M-1 | 54.9 | 4,400 | 1.6 |
|  | M-6 | 45.1 |  |  |
| A-5 | M-2 | 46.5 | 4,500 | 1.5 |
|  | M-6 | 53.5 |  |  |
| A-6 | M-3 | 45.7 | 4,700 | 1.6 |
|  | M-6 | 54.3 |  |  |
| A-7 | M-4 | 44.8 | 4,700 | 1.6 |
|  | M-6 | 55.2 |  |  |
| A-8 | M-1 | 67.5 | 6,100 | 1.7 |
|  | M-9 | 32.5 |  |  |
| A-9 | M-4 | 48.5 | 6,200 | 1.6 |
|  | M-9 | 51.5 |  |  |
| A-10 | M-5 | 67.2 | 4,500 | 1.7 |
|  | M-6 | 32.8 |  |  |
| A-11 | M-5 | 68.1 | 6,100 | 1.6 |
|  | M-9 | 31.9 |  |  |

Synthesis of Polymer (B)>

Monomers (compounds (M-A) to (M-F)) used in synthesizing the polymer (B) (polymers (B-1) and (B-2)) are shown below.

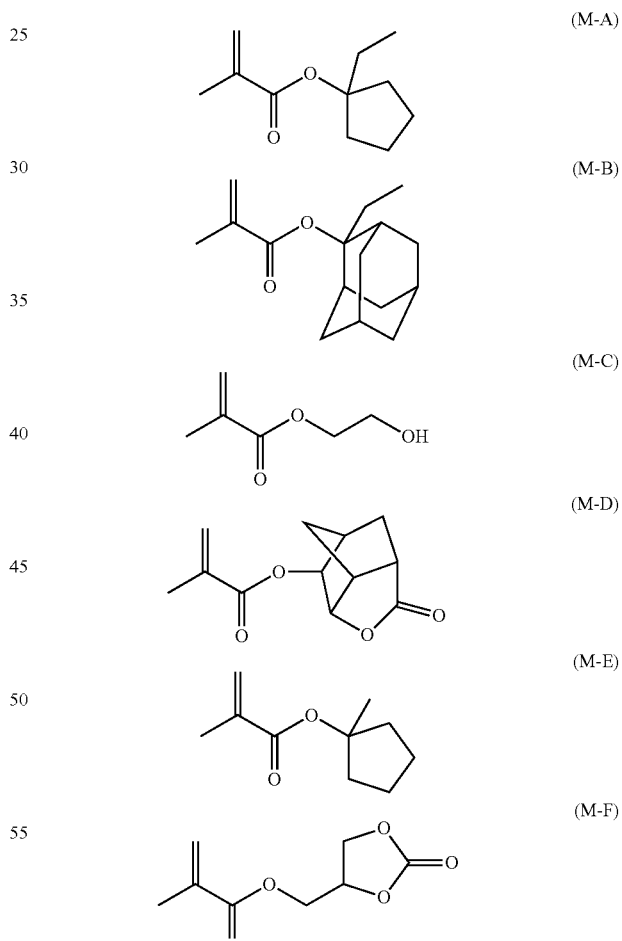

Synthesis Example 12

Synthesis of Polymer (B-1)

A monomer solution was obtained by dissolving 31.63 g (35 mol %) of the compound (M-A), 12.32 g (10 mol %) of the compound (M-B), 6.45 g (10 mol %) of the compound (M-C), and 49.60 g (45 mol %) of the compound (M-D) in 200 g of 2-butanone, and further adding thereto 8.14 g of 2,2'-azobisisobutyronitrile (10 mol % with respect to the total amount of the monomers).

On the other hand, a 500 mL three-neck flask charged with 100 g of 2-butanone was purged with nitrogen for 30 min. After purging with nitrogen, the mixture was heated to 80° C. while stirring, and the monomer solution was thereto added dropwise using a dropping funnel over 3 hrs. A time point when the dropwise addition was defined as polymerization starting, and the polymerization reaction was allowed for 6 hrs. After completing the polymerization, the polymer solution was cooled to no higher than 30° C. by water chilling, and the solution was charged into 4,000 g of methanol to permit precipitation of white powder. Thereafter, the precipitated white powder was filtered. The white powder thus filtered was washed twice by making a slurry form using 800 g of methanol, and then filtered. Thereafter, the powder was dried at 50° C. for 17 hrs to obtain a polymer (B-1) of white powder (70 g, yield: 70%).

The polymer (B-1) had Mw of 4,300, and Mw/Mn of 1.3. As a result of the $^{13}$C-NMR analysis, the polymer (B-1) was a copolymer in which the proportion of included each structure unit derived from each monomer was 36.8, 9.4, 10.2 and 43.6 (mol %) for (M-A), (M-B), (M-C) and (M-D).

Synthesis Example 13

Synthesis of Polymer (B-2)

Polymer (B-2) was synthesized in a similar manner to Synthesis Example 12 except that monomer compounds of the type and the blend ratio shown in the following Table 3 were used, and that 5 mol % AIBN was used with respect to the amount of the monomers.

In regard to the polymers (B-1) and (B-2), values derived by the measurement of the proportion of included structure units derived from each monomer, the weight average molecular weight (Mw) and the dispersity index (Mw/Mn) are shown in Table 4.

TABLE 3

| Polymer | Monomer species | Blend ratio (mol %) |
|---------|-----------------|---------------------|
| B-1     | M-A             | 35                  |
|         | M-B             | 10                  |
|         | M-C             | 10                  |
|         | M-D             | 45                  |
| B-2     | M-E             | 30                  |
|         | M-B             | 10                  |
|         | M-F             | 10                  |
|         | M-D             | 50                  |

TABLE 4

| Polymer | Structure unit Deriving monomer species | Proportion included (mol %) | Mw | Mw/Mn |
|---------|------------------------------------------|------------------------------|------|-------|
| B-1     | M-A                                      | 36.8                         | 4,300 | 1.3  |
|         | M-B                                      | 9.4                          |      |       |
|         | M-C                                      | 10.2                         |      |       |
|         | M-D                                      | 43.6                         |      |       |
| B-2     | M-E                                      | 31.6                         | 6,100 | 1.5  |
|         | M-B                                      | 9.3                          |      |       |
|         | M-F                                      | 9.6                          |      |       |
|         | M-D                                      | 49.5                         |      |       |

<Preparation of Radiation-Sensitive Resin Composition>

Components other than the aforementioned synthesized polymer (A) and polymer (B) for constituting the radiation-sensitive resin, i.e., (C) acid generator, (D) acid diffusion control agent and (E) solvent) are shown below.

(C) Acid Generator
 (C-1):4-cyclohexylphenyldiphenylsulfonium nonafluorobutanesulfonate (compound represented by the following formula (C-1))
 (C-2):triphenylsulfonium nonafluorobutanesulfonate (compound represented by the following formula (C-2))

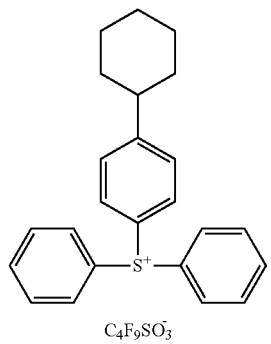

(C-1)

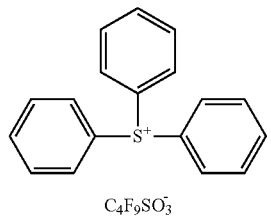

(C-2)

(D) Acid Diffusion Control Agent
 (D-1): N-t-butoxycarbonyl-4-hydroxypiperidine
 (D-2): 2-phenylbenzoimidazole
(E) Solvent
 (E-1): propylene glycol monomethyl ether acetate
 (E-2): cyclohexanone
(F) Lactone Compound
 (F-1): γ-butyrolactone Example 1

A radiation-sensitive resin composition of Example 1 was prepared by mixing 3 parts of the polymer (A-1), 100 parts of the polymer (B-1), 12 parts of the acid generator (C-1), 1 part of the acid diffusion control agent (D-1), 1,360 parts of the solvent (E-1) and 580 parts of the solvent (E-2), and 30 parts of the lactone compound (F-1).

Examples 2 to 10 and Comparative Examples 1 to 3

Radiation-sensitive resin compositions of Example 2 to 10 and Comparative Examples 1 to 3 were prepared in a similar manner to Example 1 except that each component was mixed with the type and the amount blended shown in Tables 5A and 5B below.

TABLE 5A

| | (A) Component | | (B) Polymer | | (C) Acid generator | | (D) Acid diffusion control agent | | (E) Solvent | | (F) Lactone compound | |
|---|---|---|---|---|---|---|---|---|---|---|---|---|
| | type | part | type | part | type | Part | type | part | type | part | type | part |
| Example 1 | A-1 | 3 | B-1 | 100 | C-1 | 12 | D-1 | 1 | E-1 | 1,360 | F-1 | 30 |
| | | | | | | | | | E-2 | 580 | | |
| Example 2 | A-2 | 3 | B-1 | 100 | C-1 | 12 | D-1 | 1 | E-1 | 1,360 | F-1 | 30 |
| | | | | | | | | | E-2 | 580 | | |
| Example 3 | A-3 | 3 | B-1 | 100 | C-1 | 12 | D-1 | 1 | E-1 | 1,360 | F-1 | 30 |
| | | | | | | | | | E-2 | 580 | | |
| Example 4 | A-4 | 3 | B-1 | 100 | C-1 | 12 | D-1 | 1 | E-1 | 1,360 | F-1 | 30 |
| | | | | | | | | | E-2 | 580 | | |
| Example 5 | A-5 | 3 | B-1 | 100 | C-1 | 12 | D-1 | 1 | E-1 | 1,360 | F-1 | 30 |
| | | | | | | | | | E-2 | 580 | | |
| Example 6 | A-6 | 3 | B-1 | 100 | C-1 | 12 | D-1 | 1 | E-1 | 1,360 | F-1 | 30 |
| | | | | | | | | | E-2 | 580 | | |

TABLE 5B

| | (A) Component | | (B) Polymer | | (C) Acid generator | | (D) Acid diffusion control agent | | (E) Solvent | | (F) Lactone compound | |
|---|---|---|---|---|---|---|---|---|---|---|---|---|
| | type | part | type | part | type | Part | type | part | type | part | type | part |
| Example 7 | A-7 | 3 | B-1 | 100 | C-1 | 12 | D-1 | 1 | E-1 | 1,360 | F-1 | 30 |
| | | | | | | | | | E-2 | 580 | | |
| Example 8 | A-8 | 3 | B-1 | 100 | C-1 | 12 | D-1 | 1 | E-1 | 1,360 | F-1 | 30 |
| | | | | | | | | | E-2 | 580 | | |
| Example 9 | A-9 | 3 | B-1 | 100 | C-1 | 12 | D-1 | 1 | E-1 | 1,360 | F-1 | 30 |
| | | | | | | | | | E-2 | 580 | | |
| Example 10 | A-1 | 2 | B-2 | 100 | C-2 | 10 | D-1 | 0.9 | E-1 | 1,360 | F-1 | 30 |
| | | | | | | | D-2 | 0.4 | E-2 | 580 | | |
| Comparative Example 1 | A-10 | 3 | B-1 | 100 | C-1 | 12 | D-1 | 1 | E-1 | 1,360 | F-1 | 30 |
| | | | | | | | | | E-2 | 580 | | |
| Comparative Example 2 | A-11 | 3 | B-1 | 100 | C-1 | 12 | D-1 | 1 | E-1 | 1,360 | F-1 | 30 |
| | | | | | | | | | E-2 | 580 | | |
| Comparative Example 3 | A-11 | 2 | B-2 | 100 | C-2 | 10 | D-1 | 0.9 | E-1 | 1,360 | F-1 | 30 |

<Evaluation of Radiation-Sensitive Resin Composition>

In regard to each of the radiation-sensitive resin compositions of Examples 1 to 10 and Comparative Examples 1 to 3, evaluations of bridge defect and mask error factor (MEEF) performance were made according to the following evaluation methods (1) and (2). Results of these evaluations are shown in Table 6.

(1) Inhibitory Ability of Bridge Defect

As a substrate, a 12 inch silicon wafer provided with an underlayer antireflection film having a film thickness of 77 nm on the surface thereof ("ARC29A", manufactured by Brewer Science, Inc.) was used. When the antireflection film was formed, a spin coater ("CLEAN TRACK ACT12", manufactured by Tokyo Electron Ltd.) was used.

Next, the radiation-sensitive resin composition obtained in Examples and Comparative Examples was spin coated on the substrate using CLEAN TRACK ACT12 described above, and prebaking (PB) was carried out at 120° C. for 60 sec to form a resist film having a film thickness of 150 nm. The resist film was exposed through mask pattern using an ArF excimer laser immersion scanner ("ASML AT1250i", manufactured by ASML), with settings of NA being 0.85, $\sigma_0/\sigma_1$ being 0.96/0.76, and "Annular". In this process, a liquid immersion solvent used to place between the upper face of the resist and the lens of the liquid immersion lithography device was pure water. Thereafter, post exposure bake (PEB) was carried out at 95° C. for 60 sec, and then the film was developed with a 2.38% by mass aqueous tetramethylammonium hydroxide solution at 23° C. for 60 sec, followed by washing with water and drying to form a positive type resist pattern. In this process, an exposure dose at which a line-and-space pattern of 1:1 (1L 1S) with a line width of 100 nm was formed was designated as "optimal exposure dose", and this optimal exposure dose was regarded as sensitivity. For the measurement of the line width, a scanning electron microscope ("S-9380", manufactured by Hitachi High-Technologies Corporation) was used.

Thereafter, the number of defects on the line and space pattern having a line width of 100 nm (1L 1S) was measured using a defect inspection apparatus (manufactured by KLA-Tencor Corporation, "KLA2351"). Furthermore, the defects determined with "KLA2351" were observed using a scanning electron microscope ("S-9380", manufactured by Hitachi High-Technologies Corporation), and defects of bridge type were distinguished. Accordingly, evaluation was made to be: "unfavorable" when the total number of those defects was no less than 100 per the wafer: and "favorable" when the total number of those defects was less than 100 per the wafer. The results of the evaluation are shown in Table 6.

(2) Mask Error Factor (MEEF) Performance

First, on a 12 inch silicon wafer provided with an underlayer antireflection film ("ARC66", manufactured by Nissan Chemical Industries, Ltd.) formed thereon a film having a film thickness of 110 nm was formed with the radiation-sensitive resin composition obtained in Examples and Comparative Example, and PB was carried out at 120° C. for 60 sec. Next, this film was exposed through mask pattern using an ArF excimer laser immersion scanner ("NSR S610C", manufactured by NIKON Corporation), under a condition involving NA being 1.3, the ratio being 0.800, and "Dipole".

After the exposure, PEB was carried out at 95° C. for 60 sec. Thereafter, the film was developed with a 2.38% by mass aqueous tetramethylammonium hydroxide solution, washed with water and dried to form a positive type resist pattern. In this process, an exposure dose at which a line-and-space pattern with a width of 45 nm was formed was designated as "optimal exposure dose" (Eop). A LS pattern having a pitch of 90 nm was formed at the Eop, using each mask pattern to give a target size of the line width of 40 nm, 42 nm, 44 nm, 46 nm, 48 nm and 50 nm.

Then, the line width (nm) formed on the resist film using each mask pattern was plotted along the ordinate with respect to the target size (nm) along the abscissa, and the slope of the resulting straight line was determined as MEEF performance. With respect to the MEEF performance (slope of straight line), mask reproducibility was more favorable as the value more approximates to 1. Accordingly, evaluation was made to be: "favorable" in the case of 1.00≤MEEF value<1.25; "somewhat favorable" in the case of 1.25≤MEEF value<1.50; and "unfavorable" in the case of 1.50≤MEEF value.

TABLE 6

|  | Inhibitory ability of bridge defect | MEEF performance |
| --- | --- | --- |
| Example 1 | favorable | favorable |
| Example 2 | favorable | favorable |
| Example 3 | favorable | favorable |
| Example 4 | favorable | favorable |
| Example 5 | favorable | somewhat favorable |
| Example 6 | favorable | favorable |
| Example 7 | favorable | favorable |
| Example 8 | favorable | somewhat favorable |
| Example 9 | favorable | somewhat favorable |
| Example 10 | favorable | favorable |
| Comparative Example 1 | Unfavorable | unfavorable |
| Comparative Example 2 | Unfavorable | unfavorable |
| Comparative Example 3 | Unfavorable | unfavorable |

As is clear from Table 6, when the radiation-sensitive resin compositions of Examples 1 to 10 were used, bridge defects were less likely to occur, and superior MEEF performance was achieved. Therefore, it is believed that the radiation-sensitive resin compositions can be suitably used in lithography techniques in which further miniaturization hereafter is surmised.

Obviously, numerous modifications and variations of the present invention are possible in light of the above teachings. It is therefore to be understood that within the scope of the appended claims, the invention may be practiced otherwise than as specifically described herein.

The invention claimed is:
1. A radiation-sensitive resin composition comprising:
a first polymer comprising:
a structure unit represented by formula (1-1), a structure unit represented by formula (1-2), or both thereof; and
a structure unit represented by formula (2-2), a structure unit represented by formula (2-3), or both thereof,
the first polymer having a content of fluorine atoms of no less than 5% by mass to a total mass of the first polymer;
a second polymer comprising an acid-dissociable group, and having a content of fluorine atoms of less than 5% by mass to a total mass of the second polymer; and
a radiation-sensitive acid generator,

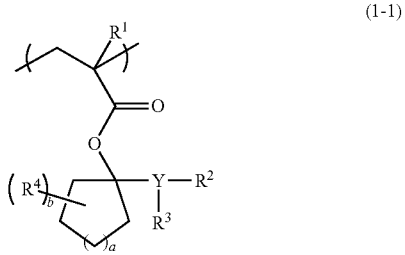

(1-1)

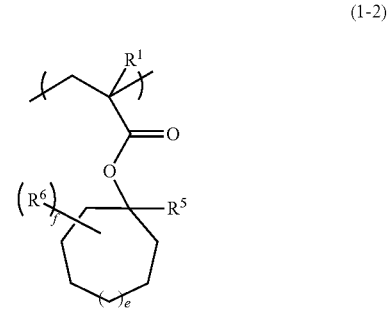

(1-2)

wherein, in the formulae (1-1) and (1-2),
each $R^1$ independently represents a hydrogen atom, a lower alkyl group or a halogenated lower alkyl group,
wherein, in the formula (1-1),
Y represents CH;
$R^2$ and $R^3$ each independently represent an alkyl group, and optionally $R^2$ and $R^3$ bind with each other to form an alicyclic structure together with Y;
$R^4$ represents an alkyl group, an alkoxy group, an acyl group or an acyloxy group;
in a case where $R^4$ is present in a plurality of number, the plurality of $R^4$ are a same or different with each other;
a part or all of hydrogen atoms of $R^4$ are substituted or unsubstituted;
a is 1 or 2; and
b is an integer of 0 to 3, and
wherein, in the formula (1-2),
$R^5$ represents an alkyl group;
$R^6$ represents an alkyl group, an alkoxy group, an acyl group or an acyloxy group;
in a case where $R^6$ is present in a plurality of number, the plurality of $R^6$ are a same or different;
a part or all of hydrogen atoms of $R^6$ are substituted or unsubstituted;
e is 1 or 2; and
f is an integer of 0 to 5,

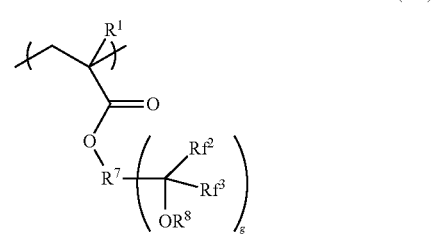

(2-2)

-continued (2-3)

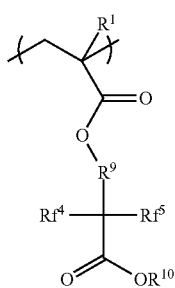

wherein, in the formulae (2-2) and (2-3),
R¹ represents a hydrogen atom, a lower alkyl group or a halogenated lower alkyl group,
wherein in the formula (2-2),
R⁷ represents a linking group having a valency of (g+1);
R⁸ represents an alkali-dissociable monovalent organic group, the alkali-dissociable monovalent organic group being a group that substitutes for a hydrogen atom in a polar functional group and that dissociates in a presence of an alkali;
in a case where R⁸ is present in a plurality of number, the plurality of R⁸ are a same or different;
Rf² and Rf³ each independently represent a hydrogen atom, a fluorine atom or a fluorinated hydrocarbon group having 1 to 30 carbon atoms, wherein at least one of Rf² and Rf³ does not represent a hydrogen atom;
in a case where Rf² or Rf³ is present in a plurality of number, the plurality of Rf² and Rf³ are each a same or different; and
g is an integer of 2 or 3, and
wherein, in the formula (2-3),
R⁹ represents a bivalent linking group;
R¹⁰ represents a hydrogen atom or a monovalent organic group; and
Rf⁴ and Rf⁵ each independently represent a hydrogen atom, a fluorine atom or a fluorinated hydrocarbon group having 1 to 30 carbon atoms, wherein at least one of Rf⁴ and Rf⁵ does not represent a hydrogen atom.

2. The radiation-sensitive resin composition according to claim 1, wherein the first polymer further comprises a structure unit, except for the structure unit represented by the formula (2-3), that comprises a group represented by formula (4-1), a group represented by formula (4-2), or both thereof, (4-1)

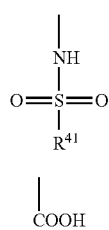

(4-2)

|
COOH wherein in the formula (4-1),
R⁴¹ represents a hydrocarbon group having 1 to 10 carbon atoms substituted with a fluorine atom.

3. The radiation-sensitive resin composition according to claim 1, wherein a content of the first polymer with respect to 100 parts by mass of the second polymer is no less than 0.1 parts by mass and no greater than 20 parts by mass.

4. A polymer comprising:

a structure unit represented by formula (1-1), a structure unit represented by formula (1-2) or both thereof; and
a structure unit represented by formula (2-2), a structure unit represented by formula (2-3), or both thereof,
the polymer having a content of fluorine atoms of no less than 5% by mass to a total mass of the first polymer,

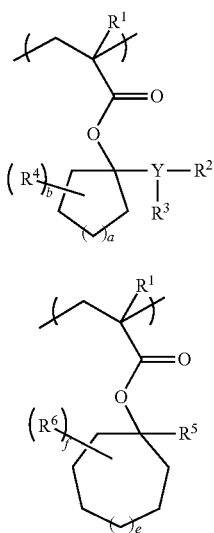

wherein, in the formulae (1-1) and (1-2),
each R¹ independently represents a hydrogen atom, a lower alkyl group or a halogenated lower alkyl group,
wherein in the formula (1-1),
Y represents CH;
R² and R³ each independently represent an alkyl group, and optionally R² and R³ bind with each other to form an alicyclic structure together with Y;
R⁴ represents an alkyl group, an alkoxy group, an acyl group or an acyloxy group;
in a case where R⁴ is present in a plurality of number, the plurality of R⁴ are a same or different with each other;
a part or all of hydrogen atoms of R⁴ are substituted or unsubstituted;
a is 1 or 2; and
b is an integer of 0 to 3, and
wherein in the formula (1-2),
R⁵ represents an alkyl group;
R⁶ represents an alkyl group, an alkoxy group, an acyl group or an acyloxy group;
in a case where R⁶ is present in a plurality of number, the plurality of R⁶ are a same or different;
a part or all of hydrogen atoms of R⁶ are substituted or unsubstituted;
e is 1 or 2; and
f is an integer of 0 to 5, (2-2)

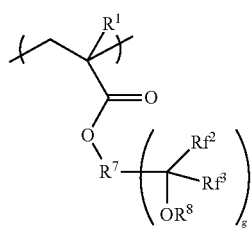

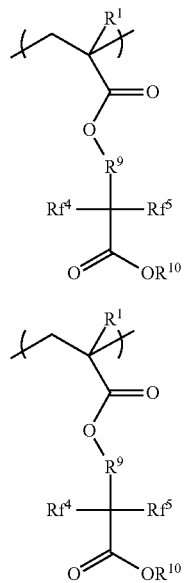

(2-3)

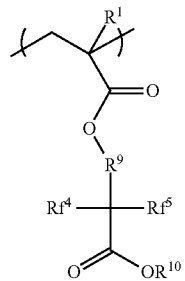

(2-3)

wherein, in the formulae (2-2) and (2-3), $R^1$ represents a hydrogen atom, a lower alkyl group or a halogenated lower alkyl group, wherein in the formula (2-2), $R^7$ represents a linking group having a valency of (g +1);

$R^8$ represents an alkali-dissociable monovalent organic group, the alkali-dissociable monovalent organic group being a group that substitutes for a hydrogen atom in a polar functional group and that dissociates in a presence of an alkali;

in a case where $R^8$ is present in a plurality of number, the plurality of $R^8$ are a same or different;

$Rf^2$ and $Rf^3$ each independently represent a hydrogen atom, a fluorine atom or a fluorinated hydrocarbon group having 1 to 30 carbon atoms, wherein at least one of $Rf^2$ and $Rf^3$ does not represent a hydrogen atom;

in a case where $Rf^2$ or $Rf^3$ is present in a plurality of number, the plurality of $Rf^2$ and $Rf^3$ are each a same or different; and g is an integer of 2 or 3, and wherein, in the formula (2-3), $R^9$ represents a bivalent linking group;

$R^{10}$ represents a hydrogen atom or a monovalent organic group; and $Rf^4$ and $Rf^5$ each independently represent a hydrogen atom, a fluorine atom or a fluorinated hydrocarbon group having 1 to 30 carbon atoms, wherein at least one of $Rf^4$ and $Rf^5$ does not represent a hydrogen atom.

5. The polymer according to claim 4 further comprising: a structure unit, except for the structure unit represented by the formula (2-3), that comprises a group represented by formula (4-1), a group represented by formula (4-2), or both thereof,

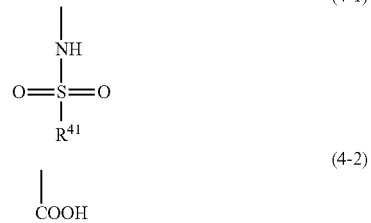

(4-1)

(4-2)

wherein, in the formula (4-1), $R^{41}$ represents a hydrocarbon group having 1 to 10 carbon atoms substituted with a fluorine atom.

6. A method for forming a resist pattern, comprising:
forming a photoresist film on a substrate using the radiation-sensitive resin composition according to claim 1;
subjecting the photoresist film to liquid immersion lithography through a liquid for immersion lithography disposed on the photoresist film; and
developing the photoresist film subjected to liquid immersion lithography to form a resist pattern.

7. A method for forming a resist pattern, comprising:
forming a photoresist film on a substrate using the radiation-sensitive resin composition according to claim 2;
subjecting the photoresist film to liquid immersion lithography through a liquid for immersion lithography disposed on the photoresist film; and
developing the photoresist film subjected to liquid immersion lithography to form a resist pattern.

8. A method for forming a resist pattern, comprising:
forming a photoresist film on a substrate using the radiation-sensitive resin composition according to claim 3;
subjecting the photoresist film to liquid immersion lithography through a liquid for immersion lithography disposed on the photoresist film; and
developing the photoresist film subjected to liquid immersion lithography to form a resist pattern.

9. The radiation-sensitive resin composition according to claim 2, wherein the structure unit that comprises a group represented by formula (4-1), a group represented by formula (4-2), or both thereof is derived from a methacrylic acid ester, an acrylic acid ester, or an α-trifluoroacrylic acid ester.

10. The polymer according to claim 5, wherein the structure unit that comprises a group represented by formula (4-1), a group represented by formula (4-2), or both thereof is derived from a methacrylic acid ester, an acrylic acid ester, or an α-trifluoroacrylic acid ester.

11. The radiation-sensitive resin composition according to claim 1, wherein the first polymer comprises the structure unit represented by the formula (1-2).

12. The polymer according to claim 4, wherein the polymer comprises the structure unit represented by the formula (1-2).

13. The radiation-sensitive resin composition according to claim 1, wherein the first polymer comprises the structure unit represented by the formula (2-3).

14. The polymer according to claim 4, wherein the polymer comprises the structure unit represented by the formula (2-3).

* * * * *